US006692883B2

(12) United States Patent
Nishiyama et al.

(10) Patent No.: US 6,692,883 B2
(45) Date of Patent: Feb. 17, 2004

(54) POSITIVE PHOTORESIST COMPOSITION

(75) Inventors: Fumiyuki Nishiyama, Shizuoka (JP); Toru Fujimori, Shizuoka (JP); Shiro Tan, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 52 days.

(21) Appl. No.: 09/838,257

(22) Filed: Apr. 20, 2001

(65) Prior Publication Data

US 2002/0012866 A1 Jan. 31, 2002

(30) Foreign Application Priority Data

Apr. 21, 2000 (JP) ..................................... P.2000-121159
Nov. 7, 2000 (JP) ..................................... P.2000-339205

(51) Int. Cl.$^7$ ............................................. G03F 7/004
(52) U.S. Cl. ..................... 430/170; 430/270.1; 430/905
(58) Field of Search ............................... 430/270.1, 905, 430/170

(56) References Cited

U.S. PATENT DOCUMENTS

| 4,491,628 A | 1/1985 | Ito et al. ..................... 430/176 |
| 5,558,971 A | 9/1996 | Urano et al. ............. 430/270.1 |
| 5,962,180 A * | 10/1999 | Iwanaga et al. ............ 430/170 |
| 6,207,343 B1 * | 3/2001 | Fujimori et al. ......... 430/270.1 |
| 6,210,859 B1 * | 4/2001 | Jeon et al. ................ 430/270.1 |
| 6,265,135 B1 * | 7/2001 | Kodama et al. ......... 430/270.1 |
| 6,376,152 B2 * | 4/2002 | Kawabe et al. .......... 430/270.1 |
| 6,485,883 B2 * | 11/2002 | Kodama et al. ............ 430/170 |
| 2001/0004130 A1 * | 11/2001 | Kodama et al. ............ 430/170 |
| 2002/0001590 A1 * | 2/2002 | Lee et al. .................... 430/170 |

FOREIGN PATENT DOCUMENTS

EP  29139  5/1981

* cited by examiner

Primary Examiner—John S. Chu
(74) Attorney, Agent, or Firm—Sughrue Mion, PLLC

(57) ABSTRACT

A positive photoresist composition is disclosed, comprising a resin having a structural unit containing a specific group and capable of decomposing under the action of an acid to increase the solubility in an alkali developer, a resin having a structural unit containing a specific group and capable of decomposing under the action of an acid to increase the solubility in an alkali developer, and a compound capable of generating an acid upon irradiation with actinic rays or radiation.

19 Claims, 1 Drawing Sheet

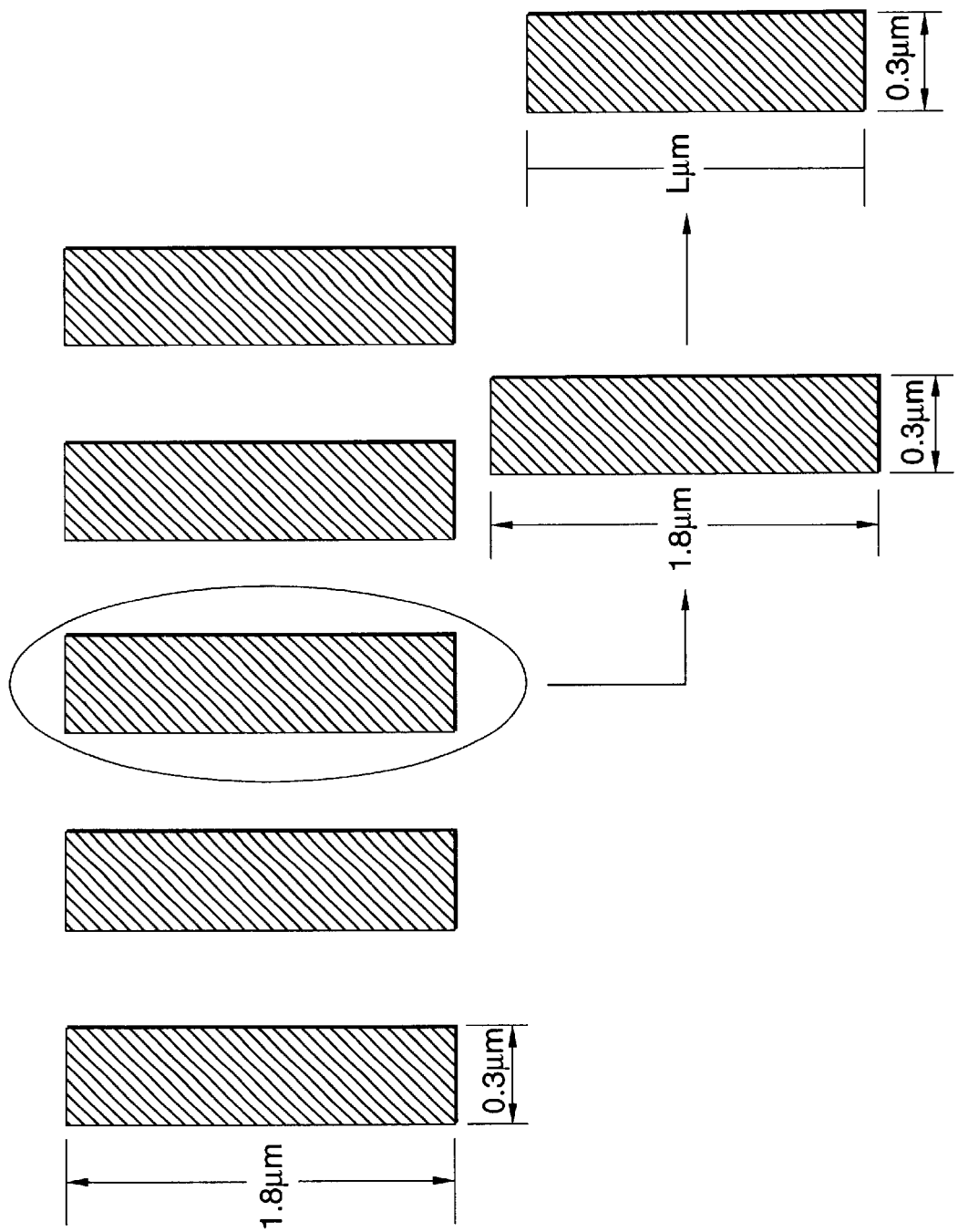

POSITIVE PHOTORESIST COMPOSITION

FIELD OF THE INVENTION

The present invention relates to a positive photoresist composition for use in the production of a semiconductor integrated circuit device, a mask for the production of an integrated circuit, a printed board, a liquid crystal panel and the like.

BACKGROUND OF THE INVENTION

The positive photoresist composition includes a chemical amplification-type photoresist composition described in U.S. Pat. No. 4,491,628 and European Patent 29,139. The chemical amplification-type photoresist is a pattern-forming material of generating an acid on the exposed area upon irradiation with radiation such as far ultraviolet ray and causing a reaction using the acid generated as a catalyst to change the solubility in a developer of the areas irradiated or not irradiated with the active radiation and thereby form a pattern on the substrate.

The chemical amplification positive photoresist composition can be roughly classified into a three-component system comprising an alkali-soluble resin, a compound capable of generating an acid upon exposure to radiation (photo-acid generator) and a dissolution-inhibiting compound for an alkali-soluble resin having an acid-decomposable group, a two-component system comprising a resin having a group capable of becoming alkali-soluble upon reaction with an acid and a photo-acid generator, and a hybrid system comprising a resin having a group capable of decomposing upon reaction with an acid and becoming alkali-soluble, a low molecular dissolution-inhibiting compound having an acid-decomposable group, and a photo-acid generator.

Various techniques have been known to improve the performance by mixing two or more resins capable of decomposing under the action of an acid and increasing in the solubility in an alkali developer (acid-decomposable resin), which are used in the above-described chemical amplification-type photoresist composition.

However, these techniques have a problem in the shortening performance. The term "shortening performance" means a phenomenon that the length in the longitudinal direction of a pattern in a line-and-space pattern is shortened.

SUMMARY OF THE INVENTION

Accordingly, the object of the present invention is to provide a chemical amplification-type positive photoresist composition free of occurrence of shortening of a line pattern edge part (in the longitudinal direction).

Under these circumstances, the present inventors have made extensive investigations, as a result, found that the above-described object can be achieved by using a positive photoresist composition having two kinds of resins each having an acid-decomposable group of specific structure. The present invention has been accomplished based on this finding.

More specifically, the positive photoresist composition of the present invention is constructed as follows.

(1) A positive photoresist composition comprising:

(a) a resin (A) having a structural unit containing a group represented by the following formula (X) and capable of decomposing under the action of an acid to increase the solubility in an alkali developer, a resin (B) having a structural unit containing a group represented by the following formula (Y) and capable of decomposing under the action of an acid to increase the solubility in an alkali developer, and (b) a compound capable of generating an acid upon irradiation with actinic rays or radiation:

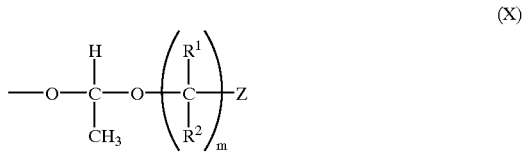

(X)

wherein $R^1$ and $R^2$, which may be the same or different, each represents a hydrogen atom, a linear, branched or cyclic alkyl group which may have a substituent, m represents an integer of 1 to 20, Z represents

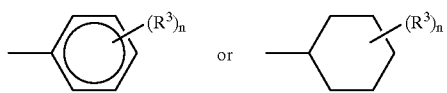

wherein $R^3$ represents a linear, branched or cyclic alkyl group which may have a substituent, an aryl group which may have a substituent, or an aralkyl group which may have a substituent, and n represents an integer of 0 to 5;

(Y)

wherein $R^4$ represents a lower alkyl group having from 1 to 4 carbon atoms.

(2) A positive photoresist composition comprising:

(a) a resin (A') having structural units represented by the following formulae (I), (II) and (III) and capable of decomposing under the action of an acid to increase the solubility in an alkali developer, a resin (B') having a structural unit represented by the following formulae (IV), (V) and (VI) and capable of decomposing under the action of an acid to increase the solubility in an alkali developer, and (b) a compound capable of generating an acid upon irradiation with actinic rays or radiation:

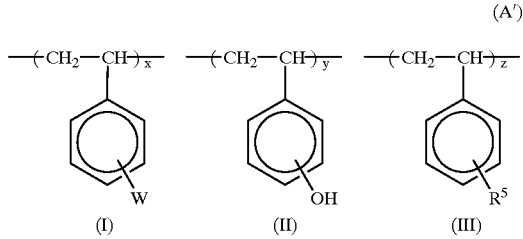

(A')

wherein $R^5$ represents an acid-stable group, W represents a group represented by formula (X), x and y each represents a number of 1 to 100, and z represents a number of 0 to 100, provided that x+y+z=100;

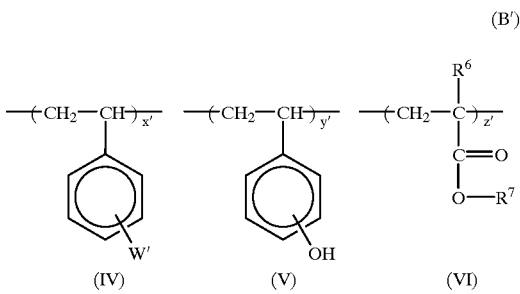

(IV) (V) (VI)

wherein $R^6$ represents a hydrogen atom or a methyl group, $R^7$ represents a linear, branched or cyclic alkyl group, an aryl group which may have a substituent or an aralkyl group which may have a substituent, W' represents a group represented by formula (Y), x' and y' each represents a number of 1 to 100, and z' represents a number of 0 to 100, provided that x'+y'+z'=100.

(3) The positive photoresist composition as described in (1) or (2), wherein the compound (b) capable of generating an acid upon irradiation with actinic rays or radiation is a compound having a sulfonium salt structure or a compound having a diazodisulfone structure.

(4) The positive photoresist composition as described in (1) or (2), wherein the compound (b) capable of generating an acid upon irradiation with actinic rays or radiation is a mixture of a compound having a sulfonium salt structure and a compound having a diazodisulfone structure.

BRIEF DESCRIPTION OF DRAWING

FIG. 1 is a view for explaining the shortening.

DETAILED DESCRIPTION OF THE INVENTION

The present invention is described in detail below.

(a)-1: The resin having a group represented by formula (X) and capable of decomposing under the action of an acid and increases in the solubility in an alkali developer.

In formula (X), $R^1$ and $R^2$ may be the same or different and each represents a hydrogen atom or a linear, branched or cyclic alkyl group which may have a substituent.

The linear alkyl group preferably has from 1 to 30 carbon atoms, more preferably from 1 to 20 carbon atoms, and examples thereof include a methyl group, an ethyl group, an n-propyl group, an n-butyl group, an n-pentyl group, an n-hexyl group, an n-heptyl group, an n-octyl group, an n-nonyl group and an n-decanyl group.

The branched alkyl group preferably has from 1 to 30 carbon atoms, more preferably from 1 to 20 carbon atoms, and examples thereof include an i-propyl group, an i-butyl group, a tert-butyl group, an i-pentyl group, a tert-pentyl group, an i-hexyl group, a tert-hexyl group, an i-heptyl group, a tert-heptyl group, an i-octyl group, a tert-octyl group, an i-nonyl group and a tert-decanoyl group.

The cyclic alkyl group preferably has from 3 to 30 carbon atoms, more preferably from 3 to 20 carbon atoms, and examples thereof include a cyclopropyl group, a cyclobutyl group, a cyclopentyl group, a cyclohexyl group, a cycloheptyl group, a cyclooctyl group, a cyclononyl group and a cylodecanoyl group.

In Z, $R^3$ represents a linear, branched cyclic alkyl group which may have a substituent, an aryl group which may have a substituent or an aralkyl group which may have a substituent.

The linear or branched alkyl group of $R^3$ preferably has from 1 to 30 carbon atoms, more preferably from 1 to 20 carbon atoms, and examples thereof include a methyl group, an ethyl group, an n-propyl group, an i-propyl group, an n-butyl group, an i-butyl group, a tert-butyl group, an n-pentyl group, an i-pentyl group, a tert-pentyl group, an n-hexyl group, an i-hexyl group, a tert-hexyl group, an n-heptyl group, an i-heptyl group, a tert-heptyl group, an n-octyl group, an i-octyl group, a tert-octyl group, an n-nonyl group, an i-nonyl group, a tert-nonyl group, an n-decanyl group, an i-decanyl group, a tert-decanyl group, an n-undecyl group, an i-undecyl group, an n-dodecyl group, an i-dodecyl group, an n-tridecyl group, an i-tridecyl group, an n-tetradecyl group, an i-tetradecyl group, an n-pentadecyl group, an i-pentadecyl group, an n-hexadecyl group, an i-hexadecyl group, an n-heptadecyl group, an i-heptadecyl group, an n-octadecyl group, an i-octadecyl group, an n-nonadecyl group and an i-nonadecyl group.

The cyclic alkyl group of $R^3$ preferably has from 3 to 30 carbon atoms, more preferably from 3 to 20 carbon atoms. Even in the case of forming a ring by having up to 20 carbon atoms, the group may be a cyclic alkyl group having a substituent and examples thereof include a cyclopropyl group, a cyclobutyl group, a cyclopentyl group, a cyclohexyl group, a cycloheptyl group, a cyclooctyl group, a cyclononyl group, a cyclodecanyl group, a cycloundecyl group, a cyclodecyl group, a cyclotridecyl group, a cyclotetradecyl group, a cyclopentadecyl group, a cyclohexadecyl group, a cycloheptadecyl group, a cyclooctadecyl group, a cyclononadecyl group, a 4-cyclohexylcyclohexyl group, a 4-n-hexylcyclohexyl group, a pentanylcyclohexyl group, a hexyloxycyclohexyl group and a pentanyloxycyclohexyl group. Substituted cyclic alkyl groups other than these may also be used as long as they have a carbon atom number falling within the above-described range.

The aryl group of $R^3$ preferably has from 6 to 30 carbon atoms, more preferably from 6 to 20 carbon atoms, and examples thereof include a phenyl group, a 4-methylphenyl group, a 3-methylphenyl group, a 2-methylphenyl group, a 4-ethylphenyl group, a 3-ethylphenyl group, a 2-ethylphenyl group, a 4-n-propylphenyl group, a 3-n-propylphenyl group, a 2-n-propylphenyl group, a 4-i-propylphenyl group, a 3-i-propylphenyl group, a 2-i-propylphenyl group, a 4-cyclopropylphenyl group, a 3-cyclopropylphenyl group, a 2-cyclopropylphenyl group, a 4-n-butylphenyl group, a 3-n-butylphenyl group, a 2-n-butylphenyl group, a 4-i-butylphenyl group, a 3-i-butylphenyl group, a 2-i-butylphenyl group, a 4-tert-butylphenyl group, a 3-tert-butylphenyl group, a 2-tert-butylphenyl group, a 4-cyclobutylphenyl group, a 3-cyclobutylphenyl group, a 2-cyclobutylphenyl group, a 4-cyclopentylphenyl group, a 4-cyclohexylphenyl group, a 4-cycloheptenylphenyl group, a 4-cyclooctanylphenyl group, a 2-cyclopentylphenyl group, a 2-cyclohexylphenyl group, a 2-cycloheptenylphenyl group, a 2-cyclooctanylphenyl group, a 3-cyclopentylphenyl group, a 3-cyclohexylphenyl group, a 3-cycloheptenylphenyl group, a 3-cyclooctanylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyloxyphenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentylphenyl group, a 4-n-hexylphenyl group, a 4-n-heptenylphenyl group, a 4-n-octanylphenyl group, a 2-n-pentylphenyl group, a 2-n-hexylphenyl group, a 2-n-heptenylphenyl group, a 2-n-octanylphenyl group, a 3-n-pentylphenyl group, a 3-n-hexylphenyl group, a 3-n-heptenylphenyl group, a 3-n-octanylphenyl group, a 2,6-di-isopropylphenyl group, a 2,3-di-isopropylphenyl group, a 2,4-di-isopropylphenyl group, a 3,4-di-isopropylphenyl group, a 3,6-di-tert-butylphenyl group, a 2,3-di-tert-butylphenyl group, a 2,4-di-tert-butylphenyl group, a 3,4-di-tert-butylphenyl group, a 2,6-di-n-butylphenyl group, a 2,3-di-n-butylphenyl group, a 2,4-di-n-butylphenyl group, a 3,4-di-n-butylphenyl group, a 2,6-di-i-butylphenyl group, a 2,3-di-i-butylphenyl group, a 2,4-di-i-butylphenyl group, a 3,4-di-i-butylphenyl group, a 2,6-di-tert-amylphenyl group, a 2,3-di-tert-amylphenyl group, a 2,4-di-tert-amylphenyl group, a 3,4-di-tert-amylphenyl group, a 2,6-di-i-amylphenyl group, a 2,3-di-i-amylphenyl group, a 2,4-di-i-amylphenyl group, a 3,4-di-i-amylphenyl group, a 2,6-di-n-pentylphenyl group, a 2,3-di-n-pentylphenyl group, a 2,4-di-n-pentylphenyl group, a 3,4-di-n-pentylphenyl group, a 4-adamantylphenyl group, a 2-adamantylphenyl group, a 4-isoboronylphenyl group, a 3-isoboronylphenyl group, a 2-isoboronylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyloxyphenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclo octanyloxyphenyl group, a 4-n-pentyloxyphenyl group, a 4-n-hexyloxyphenyl group, a 4-n-heptenyloxyphenyl group, a 4-n-octanyloxyphenyl group, a 2-n-pentyloxyphenyl group, a 2-n-hexyloxyphenyl group, a 2-n-heptenyloxyphenyl group, a 2-n-octanyloxyphenyl group, a 3-n-pentyloxyphenyl group, a 3-n-hexyloxyphenyl group, a 3-n-heptenyloxyphenyl group, a 3-n-octanyloxyphenyl group, a 2,6-di-isopropyloxyphenyl group, a 2,3-di-isopropyloxyphenyl group, a 2,4-di-isopropyloxyphenyl group, a 3,4-di-isopropyloxyphenyl group, a 2,6-di-tert-butyloxyphenyl group, a 2,3-di-tert-butyloxyphenyl group, a 2,4-di-tert-butyloxyphenyl group, a 3,4-di-tert-butyloxyphenyl group, a 2,6-di-n-butyloxyphenyl group, a 2,3-di-n-butyloxyphenyl group, a 2,4-di-n-butyloxyphenyl group, a 3,4-di-n-butyloxyphenyl group, a 2,6-di-i-butyloxyphenyl group, a 2,3-di-i-butyloxyphenyl group, a 2,4-di-i-butyloxyphenyl group, a 3,4-di-i-butyloxyphenyl group, a 2,6-di-tert-amyloxyphenyl group, a 2,3-di-tert-amyloxyphenyl group, a 2,4-di-tert-amyloxyphenyl group, a 3,4-di-tert-amyloxyphenyl group, a 2,6-di-i-amyloxyphenyl group, a 2,3-di-i-amyloxyphenyl group, a 2,4-di-i-amyloxyphenyl group, a 3,4-di-i-amyloxyphenyl group, a 2,6-di-n-pentyloxyphenyl group, a 2,3-di-n-pentyloxyphenyl group, a 2,4-di-n-pentyloxyphenyl group, a 3,4-di-n-pentyloxyphenyl group, a 4-adamantyloxyphenyl group, a 3-adamantyloxyphenyl group, a 2-adamantyloxyphenyl group, a 4-isoboronyloxyphenyl group, a 3-isoboronyloxyphenyl group and a 2-isoboronyloxyphenyl group. These groups each may further may be substituted as long as they satisfy the above-described range, and the substituent is not limited to those other than described above.

The aralkyl group of $R^3$ preferably has from 7 to 20, more preferably from 7 to 20 carbon atoms, and example thereof include a phenylethyl group, a 4-methylphenylethyl group, a 3-methylphenylethyl group, a 2-methylphenylethyl group, a 4-ethylphenylethyl group, a 3-ethylphenylethyl group, a 2-ethylphenylethyl group, a 4-n-propylphenylethyl group, a 3-n-propylphenylethyl group, a 2-n-propylphenylethyl group, a 4-i-propylphenylethyl group, a 3-i-propylphenylethyl group, a 2-i-propylphenylethyl group, a 4-cyclopropylphenylethyl group, a 3-cyclopropylphenylethyl group, a 2-cyclopropylphenylethyl group, a 4-n-butylphenylethyl group, a 3-n-butylphenylethyl group, a 2-n-butylphenylethyl group, a 4-i-butylphenylethyl group, a 3-i-butylphenylethyl group, a 2-i-butylphenylethyl group, a 4-tert-butylphenylethyl group, a 3-tert-butylphenylethyl group, a 2-tert-butylphenylethyl group, a 4-cyclobutylphenylethyl group, a 3-cyclobutylphenylethyl group, a 2-cyclobutylphenylethyl group, a 4-cyclopentylphenylethyl group, a 4-cyclohexylphenylethyl group, a 4-cycloheptenylphenylethyl group, a 4-cyclooctanylphenylethyl group, a 2-cyclopentylphenylethyl group, a 2-cyclohexylphenylethyl group, a 2-cycloheptenylphenylethyl group, a 2-cyclooctanylphenylethyl group, a 3-cyclopentylphenylethyl group, a 3-cyclohexylphenylethyl group, a 3-cycloheptenylphenylethyl group, a 3-cyclooctanylphenylethyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxyphenylethyl group, a 2-cyclohexyloxyphenylethyl group, a 2-cycloheptenyloxyphenylethyl group, a 2-cyclooctanyloxyphenylethyl group, a 3-cyclopentyloxyphenylethyl group, a 3-cyclohexyloxyphenylethyl group, a 3-cycloheptenyloxyphenylethyl group, a 3-cyclooctanyloxyphenylethyl group, a 4-n-pentylphenylethyl group, a 4-n-hexylphenylethyl group, a 4-n-heptenylphenylethyl group, a 4-n-octanylphenylethyl group, a 2-n-pentylphenylethyl group, a 2-n-hexylphenylethyl group, a 2-n-heptenylphenylethyl group, a 2-n-octanylphenylethyl group, a 3-n-pentylphenylethyl group, a 3-n-hexylphenylethyl group, a 3-n-heptenylphenylethyl group, a 3-n-octanylphenylethyl group, a 2,6-di-isopropylphenylethyl group, a 2,3-di-isopropylphenylethyl group, a 2,4-di-isopropylphenylethyl group, a 3,4-di-isopropylphenylethyl group, a 2,6-di-tert-butylphenylethyl group, a 2,3-di-tert-butylphenylethyl group, a 2,4-di-tert-butylphenylethyl group, a 3,4-di-tert-butylphenylethyl group, a 2,6-di-n-butylphenylethyl group, a 2,3-di-n-butylphenylethyl group, a 2,4-di-n-butylphenylethyl group, a 3,4-di-n-butylphenylethyl group, a 2,6-di-i-butylphenylethyl group, a 2,3-di-i-butylphenylethyl group, a 2,4-di-i-butylphenylethyl group, a 3,4-di-i-butylphenylethyl group, a 2,6-di-tert-amylphenylethyl group, a 2,3-di-tert-amylphenylethyl group, a 2,4-di-tert-amylphenylethyl group, a 3,4-di-tert-amylphenylethyl group, a 2,6-di-i-amylphenylethyl group, a 2,3-di-i-amylphenylethyl group, a 2,4-di-i-amylphenylethyl group, a 3,4-di-i-amylphenylethyl group, a 2,6-di-n-pentylphenylethyl group, a 2,3-di-n-pentylphenylethyl group, a 2,4-di-n-pentylphenylethyl group, a 3,4-di-n-pentylphenylethyl group, a 4-adamantylphenylethyl group, a 3-adamantylphenylethyl group, a 2-adamantylphenylethyl group, a 4-isoboronylphenylethyl group, a 3-isoboronylphenylethyl group, a 2-isoboronylphenylethyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxyphenylethyl group, a 2-cyclohexyloxyphenylethyl group, a 2-cycloheptenyloxyphenylethyl group, a 2-cyclooctanyloxyphenylethyl group, a 3-cyclopentyloxyphenylethyl group, a 3-cyclohexyloxyphenylethyl group, a 3-cycloheptenyloxyphenylethyl group, a 3-cyclooctanyloxyphenylethyl group, a 4-n-pentyloxyphenylethyl group, a 4-n-hexyloxyphenylethyl group, a 4-n-heptenyloxyphenylethyl group, a 4-n-octanyloxyphenylethyl group, a 2-n-pentyloxyphenylethyl group, a 2-n-hexyloxyphenylethyl group, a 2-n-heptenyloxyphenylethyl group, a 2-n-octanyloxyphenylethyl group, a 3-n-pentyloxyphenylethyl group, a 3-n-hexyloxyphenylethyl group, a 3-n-heptenyloxyphenylethyl group, a 3-n-octanyloxyphenylethyl group, a 2,6-di-isopropyloxyphenylethyl group, a 2,3-di-isopropyloxyphenylethyl group, a 2,4-di-isopropyloxyphenylethyl group, a 3,4-di-isopropyloxyphenylethyl group, a 2,6-di-tert-butyloxyphenylethyl group, a 2,3-di-tert-butyloxyphenylethyl group, a 2,4-di-tert-butyloxyphenylethyl group, a 3,4-di-tert-butyloxyphenylethyl group, a 2,6-di-n-butyloxyphenylethyl group, a 2,3-di-n-butyloxyphenylethyl group, a 2,4-di-n-butyloxyphenylethyl group, a 3,4-di-n-butyloxyphenylethyl group, a 2,6-di-i-butyloxyphenylethyl group, a 2,3-di-i-butyloxyphenylethyl group, a 2,4-di-i-butyloxyphenylethyl group, a 3,4-di-i-butyloxyphenylethyl group, a 2,6-di-tert-amyloxyphenylethyl group, a 2,3-di-tert-amyloxyphenylethyl group, a 2,4-di-tert-amyloxyphenylethyl group, a 3,4-di-tert-amyloxyphenylethyl group, a 2,6-di-i-amyloxyphenylethyl group, a 2,3-di-i-amyloxyphenylethyl group, a 2,4-di-i-amyloxyphenylethyl group, a 3,4-di-i-amyloxyphenylethyl group, a 2,6-di-n-pentyloxyphenylethyl group, a 2,3-di-n-pentyloxyphenylethyl group, a 2,4-di-n-pentyloxyphenylethyl group, a 3,4-di-n-pentyloxyphenylethyl group, a 4-adamantyloxyphenylethyl group, a 3-adamantyloxyphenylethyl group, a 2-adamantyloxyphenylethyl group, a 4-isoboronyloxyphenylethyl group, a 3-isoboronyloxyphenylethyl group, a 2-isoboronyloxyphenylethyl group, and those resultant from replacing the alkyl of the above-described groups by a methyl group, a propyl group, a butyl group or the like.

Examples of the substituent which is further substituted to the above-described groups include a hydroxyl group, a halogen atom (e.g., fluorine, chlorine, bromine, iodine), a nitro group, a cyano group, the alkyl groups described above, an alkoxy group such as methoxy group, ethoxy group, hydroxyethoxy group, propoxy group, hydroxypropoxy group, n-butoxy group, isobutoxy group, sec-butoxy group and tert-butoxy group, an alkoxycarbonyl group such as methoxycarbonyl group and ethoxycarbonyl group, an aralkyl group such as benzyl group, phenethyl group and cumyl group, an acyl group such as aralkyloxy group, formyl group, acetyl group, butyryl group, benzoyl group, cyanamyl group and valeryl group, an acyloxy group such as butyryloxy group, the above-described alkenyl groups, an alkenyloxy group such as vinyloxy group, propenyloxy group, allyloxy group and butenyloxy group, the above-described aryl groups, an aryloxy group such as phenoxy group, and an aryloxycarbonyl group such as benzoyloxy group.

Among these substituents of $R^3$, preferred are an alkyl group having from 1 to 20 carbon atoms, an aryl group having from 6 to 20 carbon atoms and an aralkyl group having from 7 to 20 carbon atoms. These substituents each may further have a substituent.

Specific examples of the group represented by formula (X) are set forth below, however, the present invention is not limited thereto.

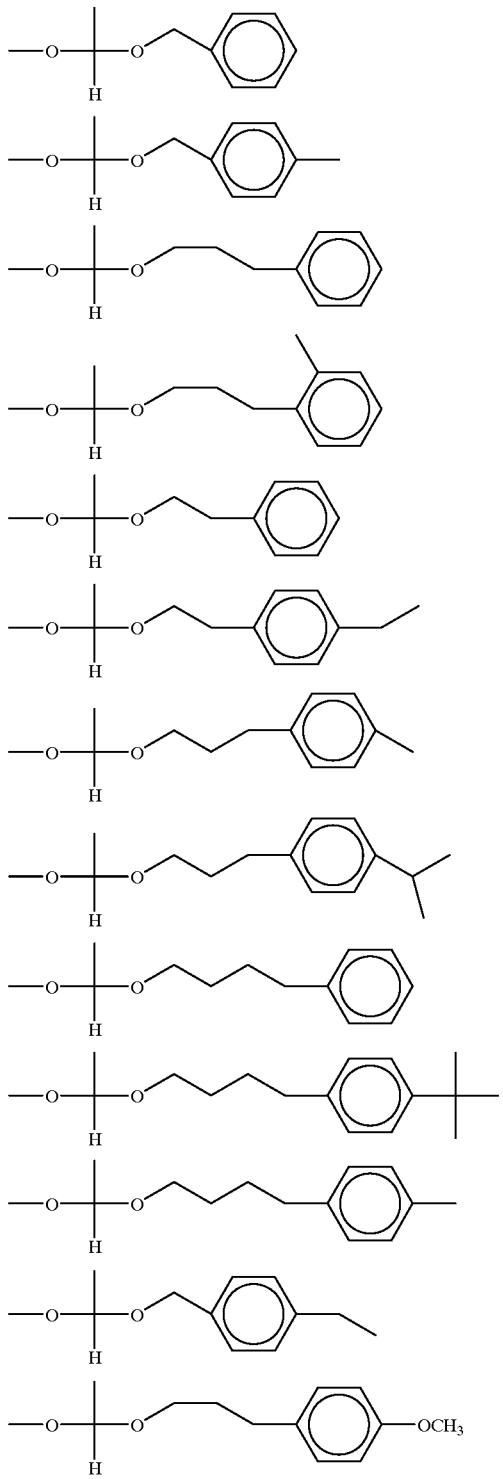

-continued

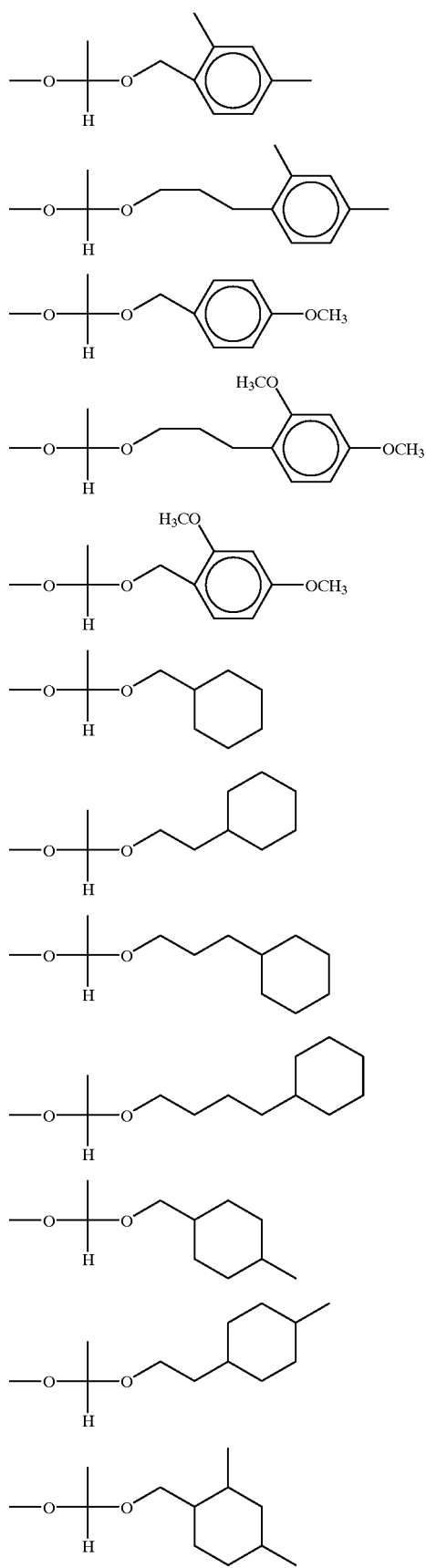

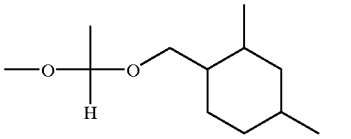
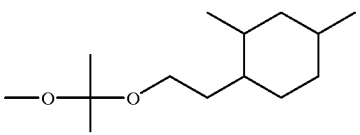
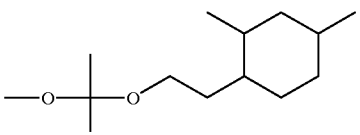
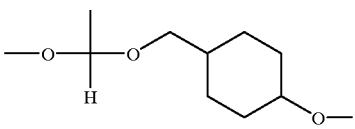
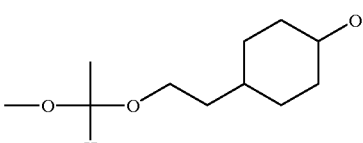

In the present invention, the resin having a group represented by formula (X) and capable of decomposing under the action of an acid to increase the solubility in an alkali developer (hereinafter sometimes referred to as a "resin having a group represented by formula (X)") is a compound having a structure such that an acid-decomposable group represented by formula (X) is introduced into a compound obtained by polymerizing a monomer and having a molecular weight distribution, and capable of becoming alkali-soluble under the action of an acid.

The resin having a group represented by formula (X) is a resin having a group represented by formula (X) on the main or side chain or on both main and side chains of the resin. Among these, a resin having a group represented by formula (X) on the side chain is preferred.

In the case where the group represented by formula (X) is bonded as a side chain, the mother moiety resin is preferably an alkali-soluble resin having a —OH or —COOH group, preferably a —R⁰—COOH or —Ar—OH group on the side chain (wherein —R⁰— represents a divalent or greater valence aliphatic or aromatic hydrocarbon which may have a substituent, and —Ar— represents a divalent or greater valence aromatic group which may have a polycyclic substituent).

In the present invention, the mother moiety resin is preferably an alkali-soluble resin having a phenolic hydroxyl group.

The alkali-soluble resin having a phenolic hydroxyl group for use in the present invention is preferably a copolymer containing at least 30 mol %, preferably 50 mol % or more of a repeating unit corresponding to o-, m- or p-hydroxystyrene (these are collectively called "hydroxystyrene") or o-, m- or p-hydroxy-α-methylstyrene (these are collectively called "hydroxy-α-methylstyrene), a homopolymer thereof or a resin where the benzene nucleus of this unit is partially hydrogenated, more preferably a p-hydroxystyrene homopolymer.

Other than hydroxystyrene and hydroxy-α-methylstyrene, preferred examples of the monomer for the copolymerization of the copolymer include acrylic acid esters, methacrylic acid esters, acrylamides, methacrylamides, acrylonitrile, methacrylonitrile, maleic anhydride, styrene, α-methylstyrene, acetoxystyrene and alkoxystyrenes. Among these, styrene, acetoxystyrene and tert-butoxystyrene are more preferred.

In the present invention, the content of the repeating unit (structural unit) having a group represented by formula (X) in the resin is preferably 5 to 50 mol %, more preferably from 5 to 30 mol %, based on all repeating units.

In the present invention, the resin having a group represented by formula (X) may contain other acid-decomposable group in addition to the group represented by formula (X).

The resin having a group represented by formula (X) may be obtained by synthesizing a corresponding vinyl ether and reacting it with a phenolic hydroxyl group-containing alkali-soluble resin dissolved in an appropriate solvent such as tetrahydrofuran according to a known method. The reaction is performed in the presence of a normal acidic catalyst, preferably, an acidic ion exchange resin, a hydrochloric acid, a p-toluene sulfonic acid or a salt such as pyridinium tosylate. The corresponding vinyl ether may be synthesized from an active starting material such as chloroethyl vinyl ether by a method such as nucleophilic substitution reaction or may be synthesized using mercury or palladium catalyst.

The corresponding vinyl ether may also be synthesized by another method of performing acetal exchange using corresponding alcohol and vinyl ether. In this case, the acetal exchange is performed in the presence of an acid such as p-toluenesulfonic acid or pyridinium tosylate while letting to carry a substituent intended to introduce and using vinyl ether in which a relatively unstable vinyl ether such as t-butyl vinyl ether is mixed.

Specific examples of the structure of the resin having a group represented by formula (X) are set froth below, however, the present invention is not limited thereto.

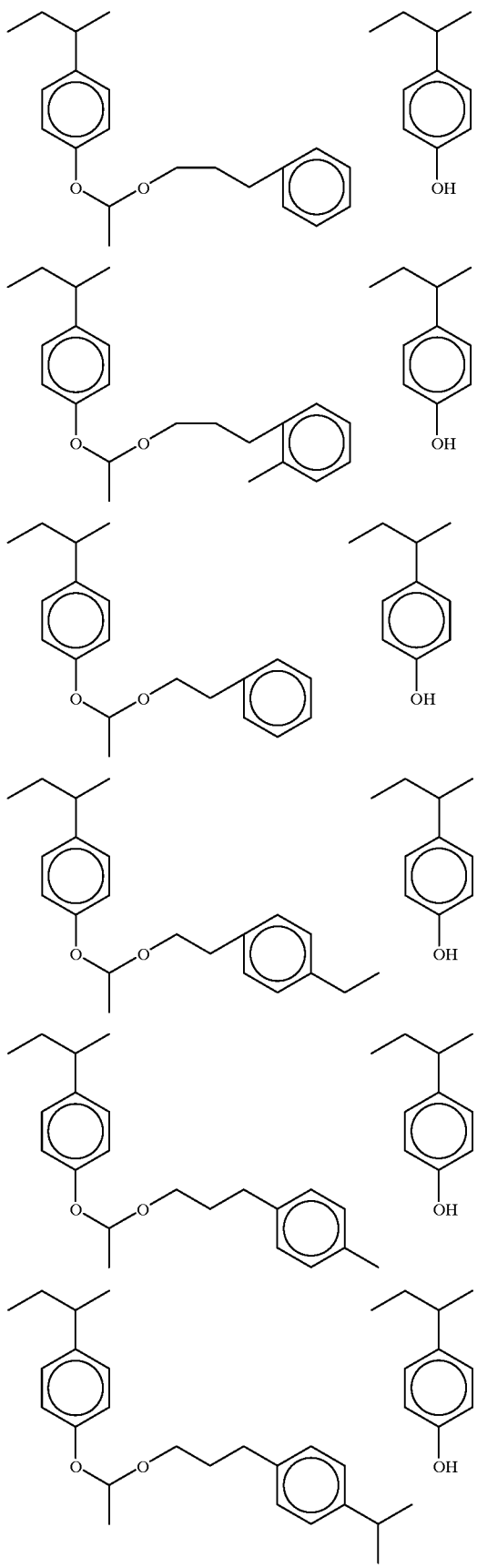

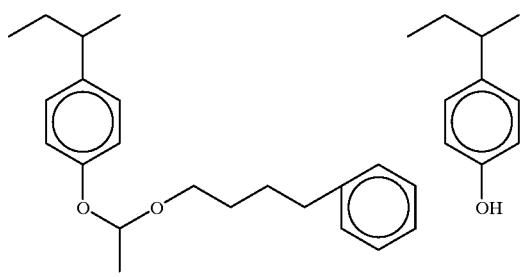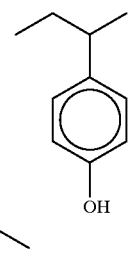
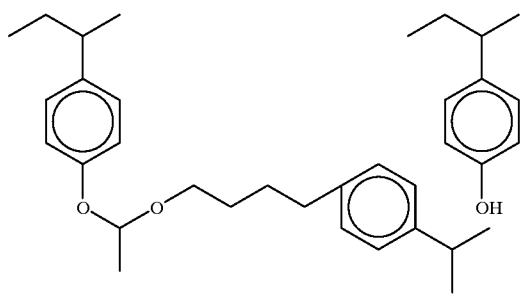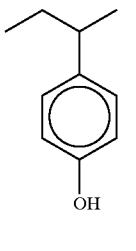
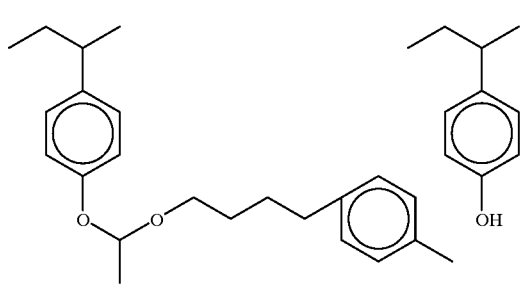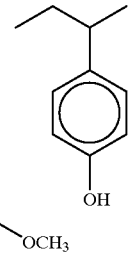
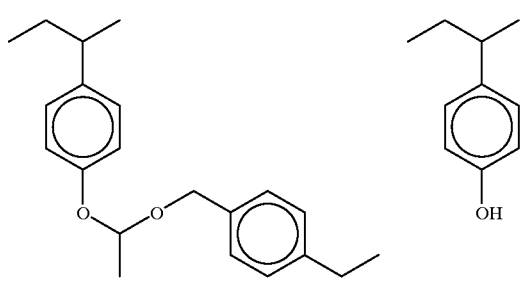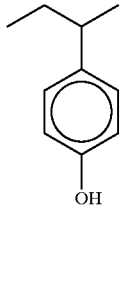
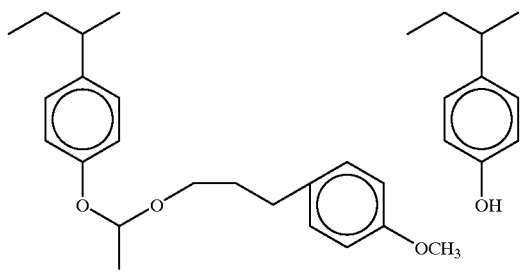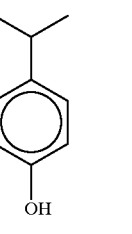
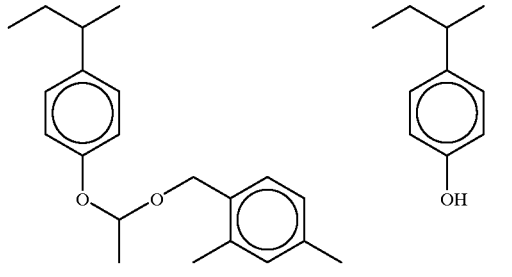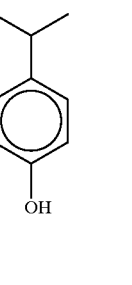

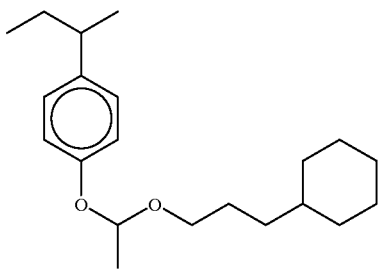
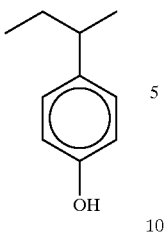
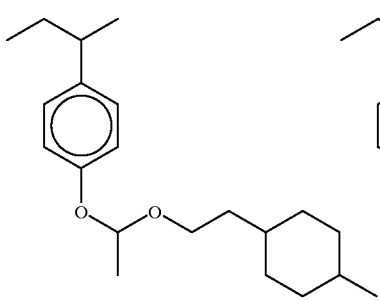
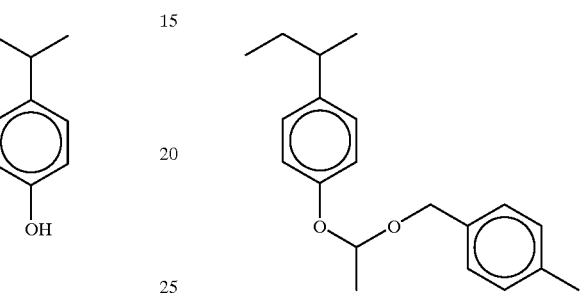
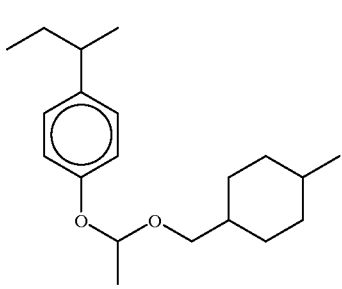
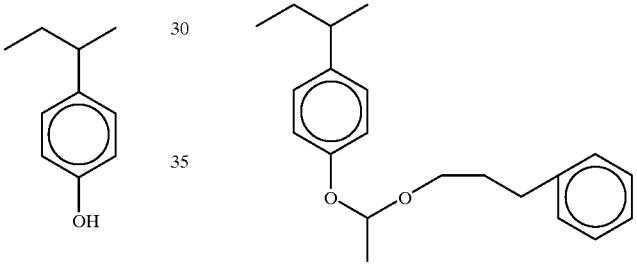
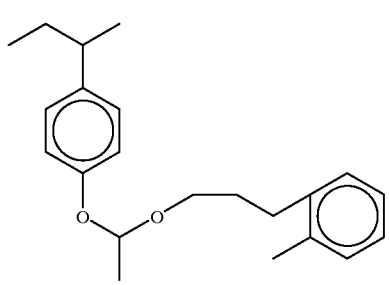
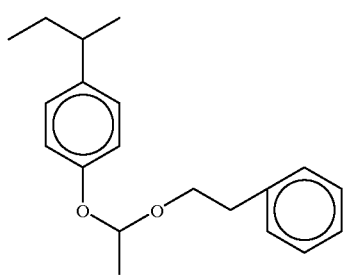

(a)-2: The resin (A') having structural units represented by formulae (I), (II) and (III) and capable of decomposing under the action of an acid to increase the solubility in an alkali developer.

The group incapable of decomposing under the action of an acid (called acid-stabile group) of $R^5$ includes a hydrogen atom, a halogen atom, an alkyl group, an alkoxy group and an acyloxy group.

In the acid-stable group of $R^5$, the alkyl group is preferably an alkyl group having from 1 to 4 carbon atoms, such as methyl group, ethyl group, propyl group, n-butyl group, sec-butyl group and tert-butyl group. The alkoxy group is preferably an alkoxy group having from 1 to 4 carbon atoms such as methoxy group, ethoxy group, hydroxyethoxy group, propoxy group, hydroxypropoxy group, n-butoxy group, isobutoxy group, and sec-butoxy group. The acyloxy group is preferably an acyloxy group having from 2 to 7 carbon atoms such as acetoxy group, propanoyloxy group, butanoyloxy group and benzoyloxy group.

The substituent W in formula (I) is the same as formula (X), and formula (X) is as described above.

Specific examples of the structure of the structural unit represented by formula (I) are set forth below, however, the present invention is not limited thereto.

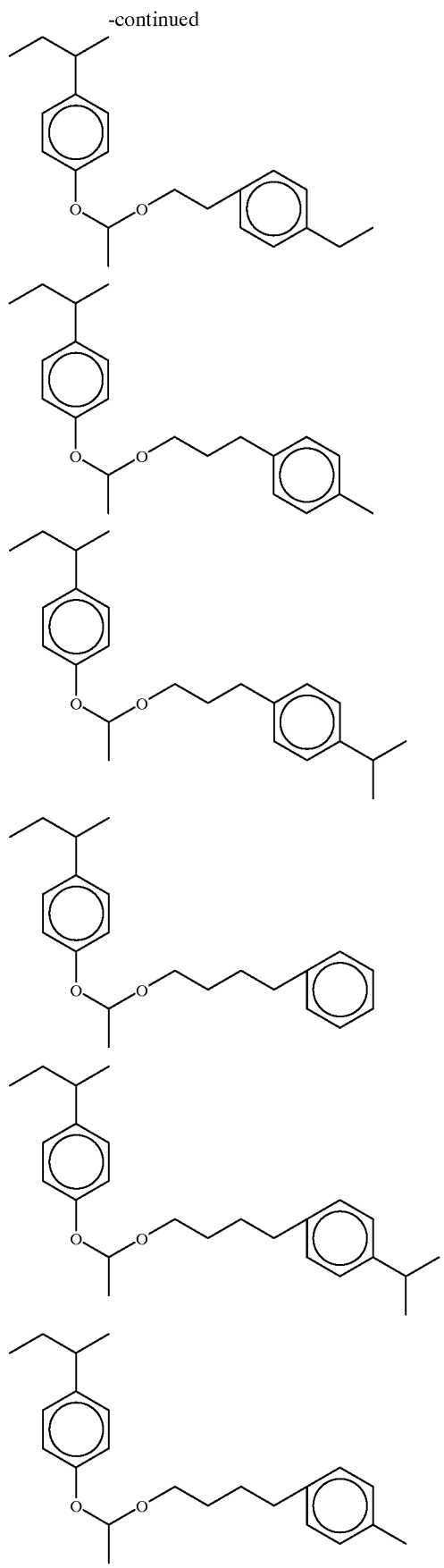

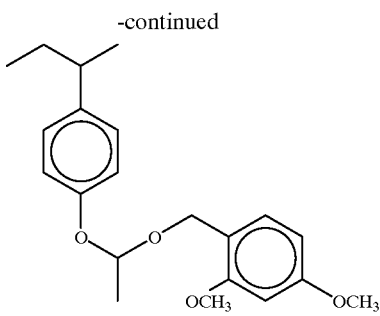
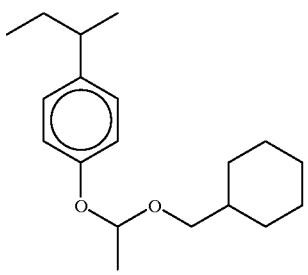
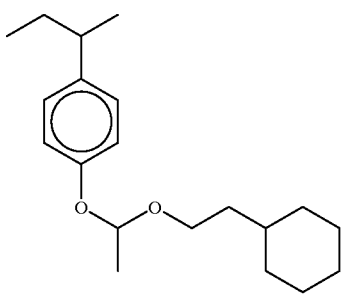
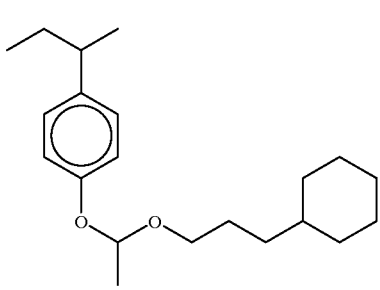
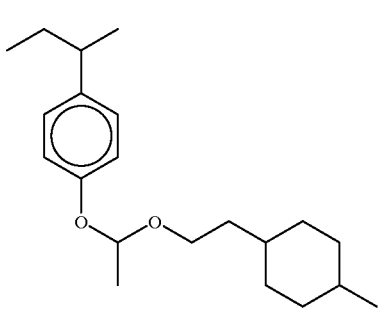

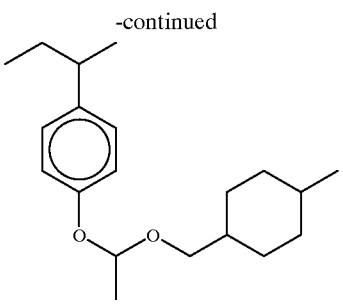

By incorporating the structural unit represented by formula (III) into a resin, the resin can decompose under the action of an acid and can be controlled in the solubility in an alkali developer.

Furthermore, by introducing this structural unit, a profile having excellent rectangularity can be achieved. This is also effective in adjusting the amount of the structural unit represented by formula (I).

Specific examples of the polymerizable monomer of the structural unit represented by formula (III) are set forth below, however, the present invention is not limited thereto.

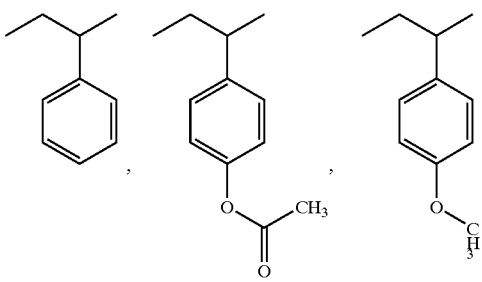
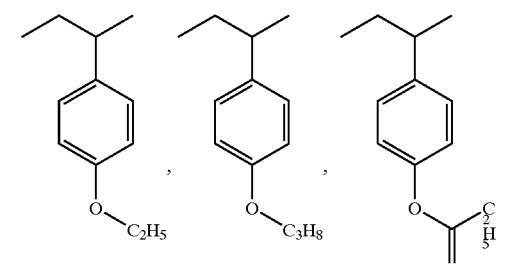
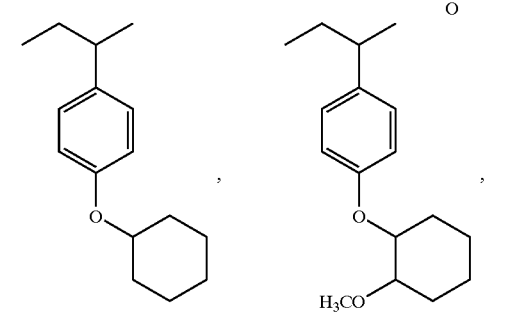
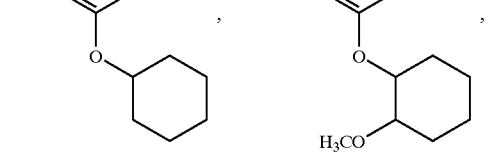

-continued

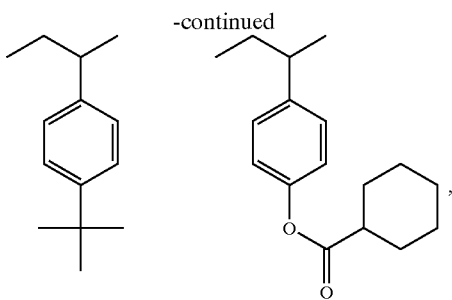

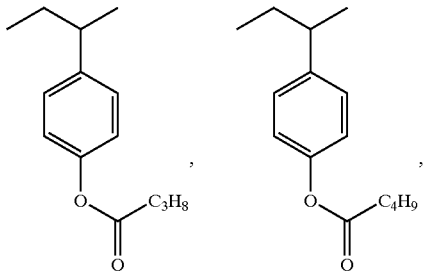

The resin containing the structural unit represented by formula (II) or (II) can be obtained, for example, by reacting a phenolic resin or a monomer thereof with an acid anhydride or a corresponding halide in the presence of a base.

In the present invention, the resin (A') capable of decomposing under the action of an acid to increase the solubility in an alkali developer may contain other monomer unit as a copolymerization component, in addition to the structural units represented by formulae (I), (II) and (III).

In the resin (A') capable of decomposing under the action of an acid to increase the solubility in an alkali developer, the ratio among x, y and z preferably satisfies the following conditions:
when z=0,
    $0.05 < x/(x+y) < 0.50$, preferably $0.1 < x/(x+y) < 0.45$,
when z>0,
    (i) $0.05 < x/(x+y+z) < 0.35$, (ii) $0.005 < z/(x+y+z) < 0.25$, (iii) $x \geq z$, and (iv) $0.5 < x/(x+z) < 0.95$,
preferably
    (i) $0.1 < x/(x+y+z) < 0.25$, (ii) $0.01 < z/(x+y+z) < 0.15$, (iii) $x \geq z$, and (iv) $0.5 < x/(x+z) < 0.85$.

By satisfying these conditions, the resin of the present invention is improved in the rectangularity of profile, particularly, more improved in the development defect.

The repeating structural units represented by formulae (I), (II) and (III) and the repeating structural unit from other polymerizable monomer each may be used individually or in combination of two or more thereof and allowed to be present in the resin.

In the resin contained in the positive photosensitive composition of the present invention, an appropriate other polymerizable monomer may be copolymerized to introduce an alkali-soluble group such as phenolic hydroxyl group or carboxyl group, so as to maintain good developability for an alkali developer.

The molecular weight of the resin A (including the resin A') is in terms of the weight average molecular weight (Mw, polystyrene base) 2,000 or more, preferably from 3,000 to 200,000, more preferably from 5,000 to 70,000. The dispersion degree (Mw/Mn) is preferably from 1.0 to 4.0, more preferably from 1.0 to 3.5, still more preferably from 1.0 to 3.0. As the dispersion degree is smaller, the heat resistance and image-forming properties (e.g., pattern profile, defocus latitude) are better.

The content of the resin A (including the resin A') in the positive photosensitive composition (excluding a coating solvent) is preferably from 50 to 99 wt %, more preferably from 70 to 97 wt %.

Specific examples of the resin having repeating structural units represented by formulae (I), (II) and (III) are set forth below, however, the present invention is not limited thereto.

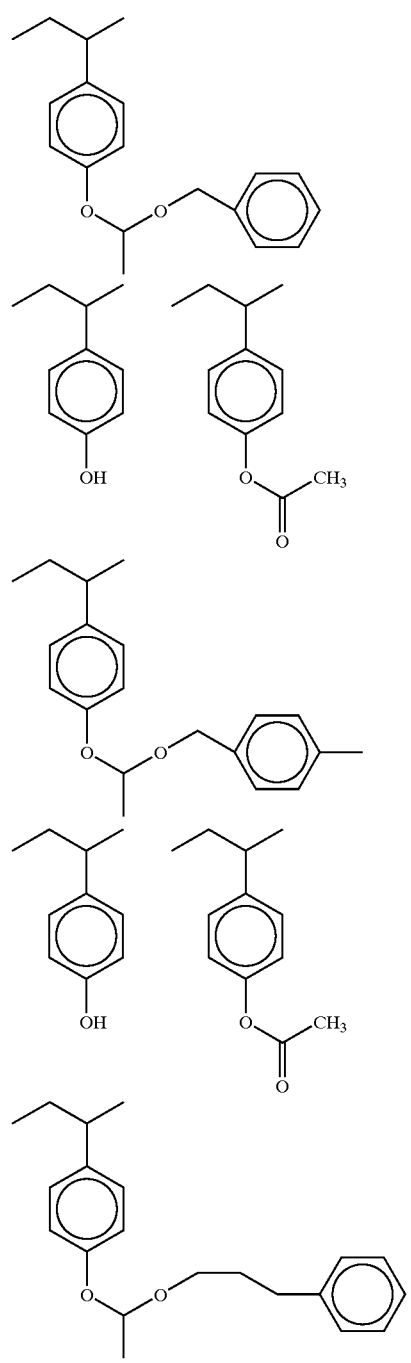

-continued
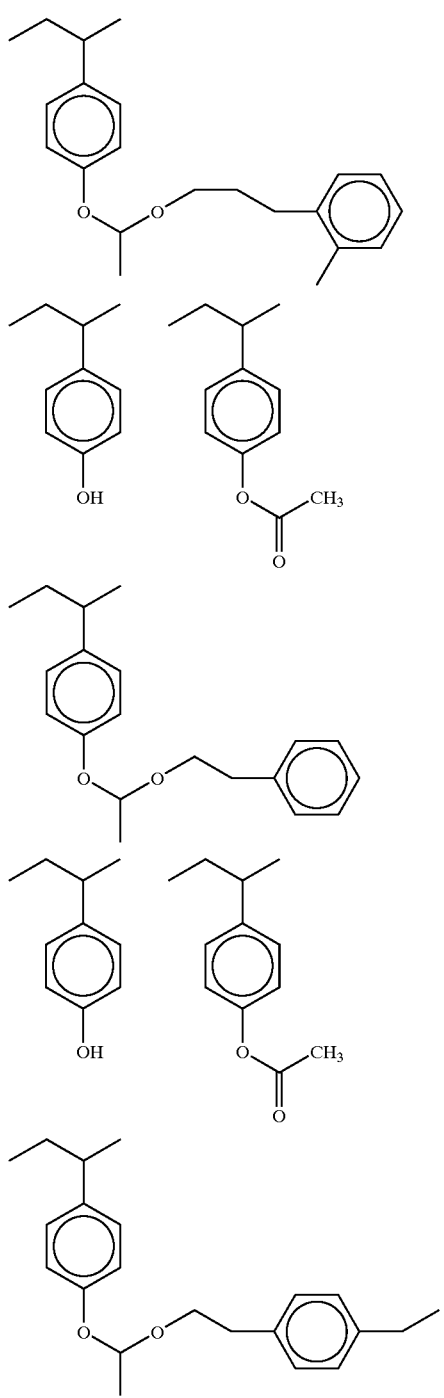
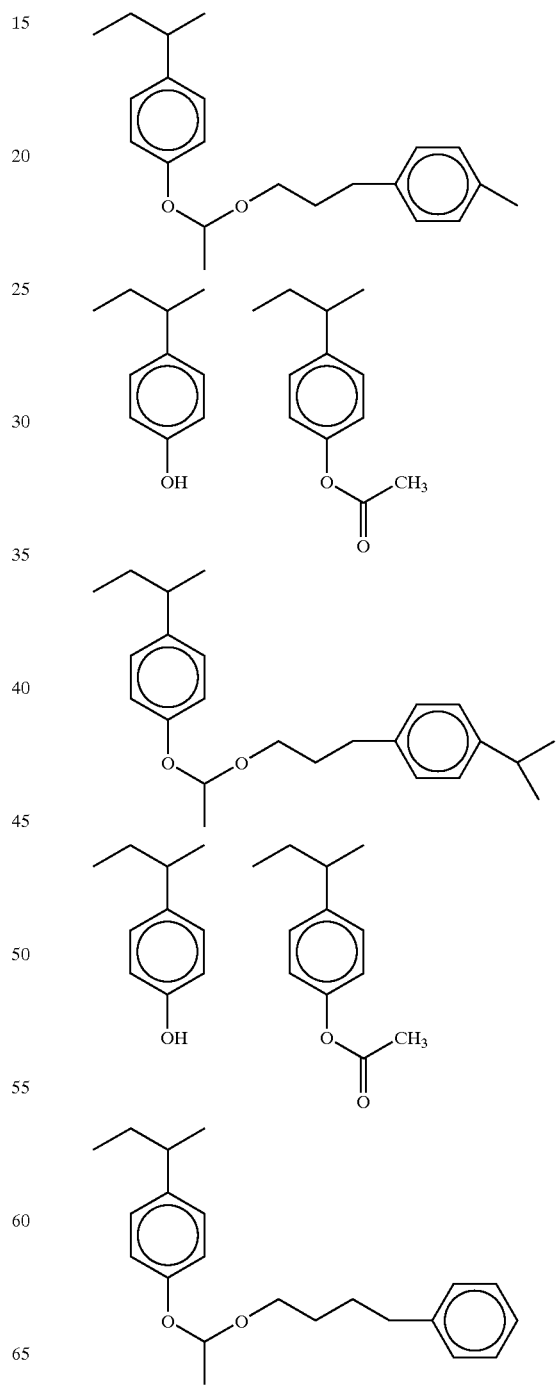

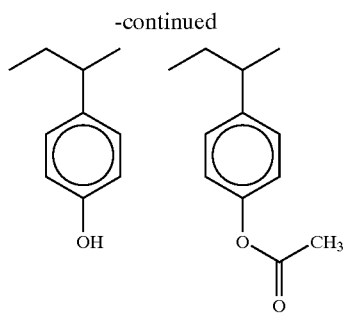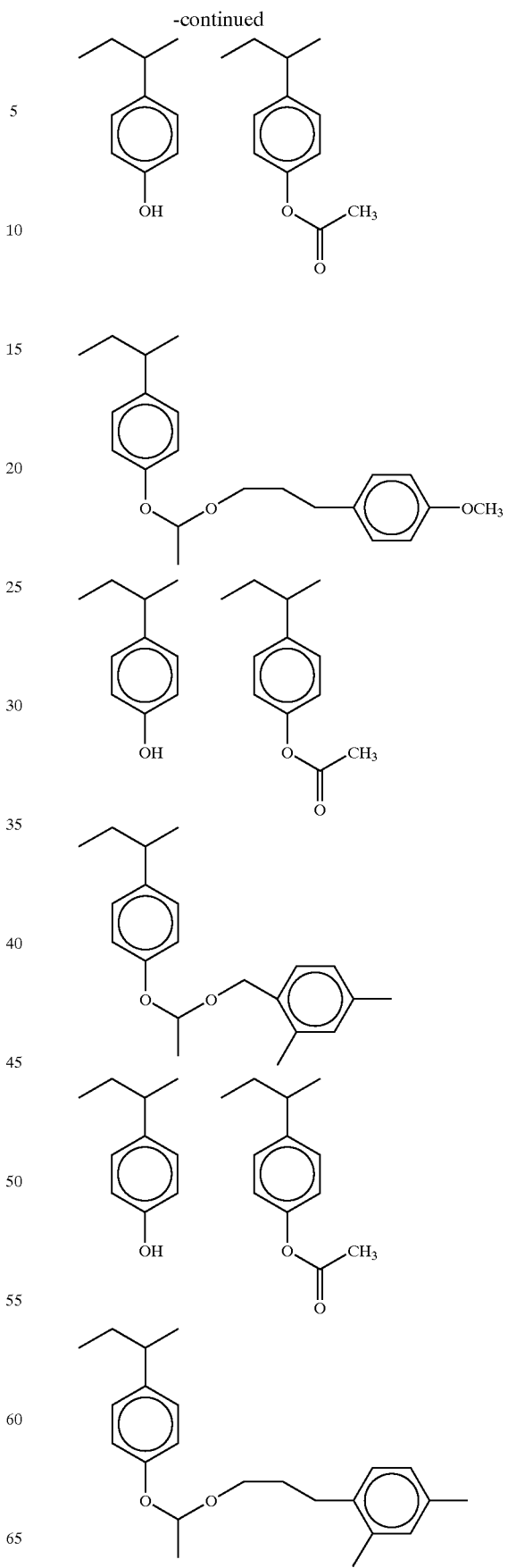

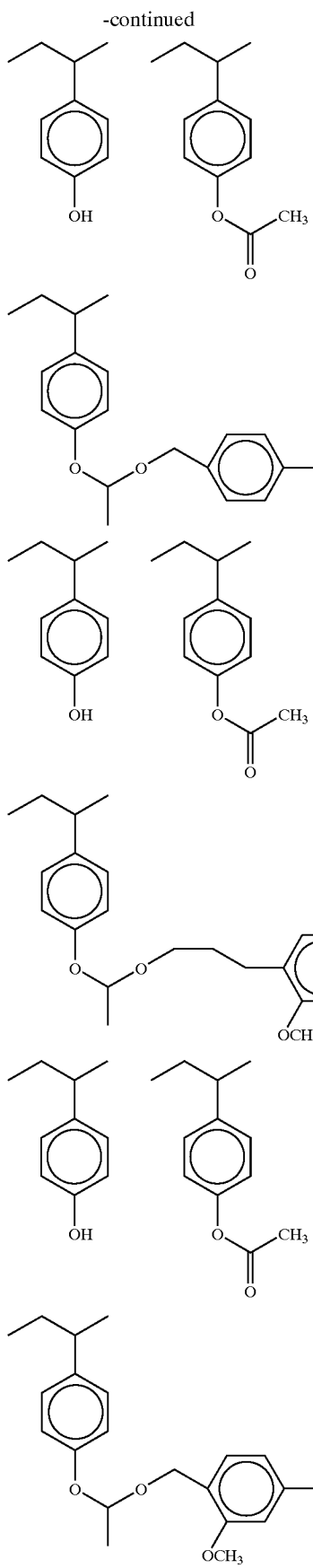

-continued
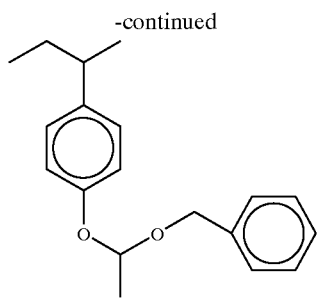
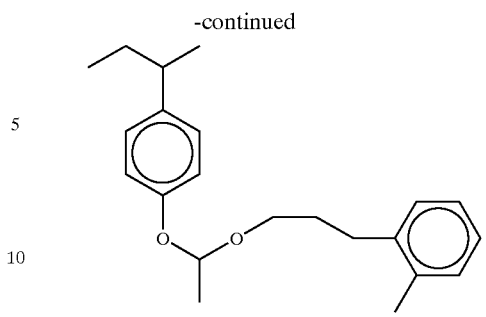
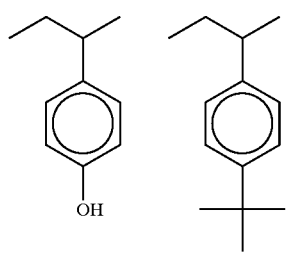
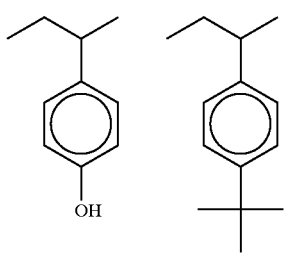
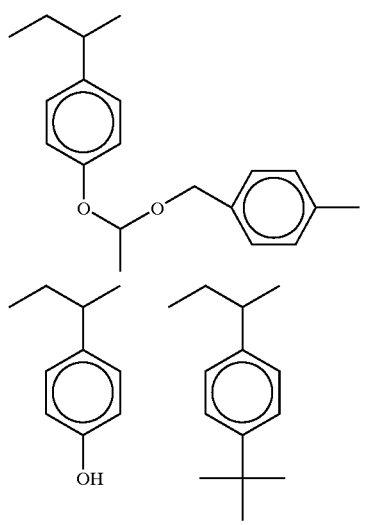
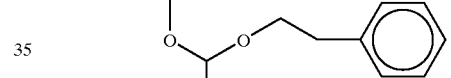
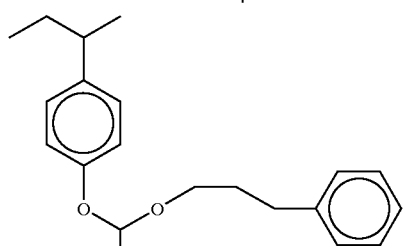
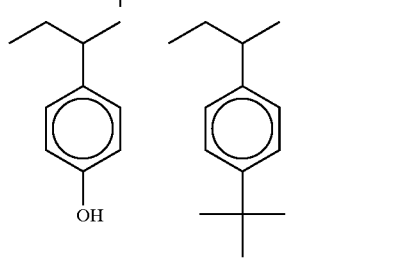

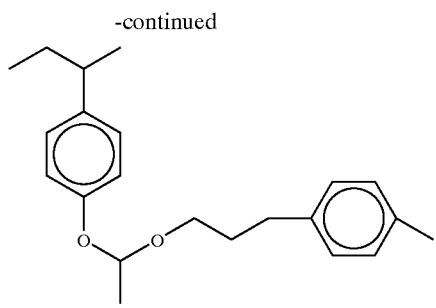
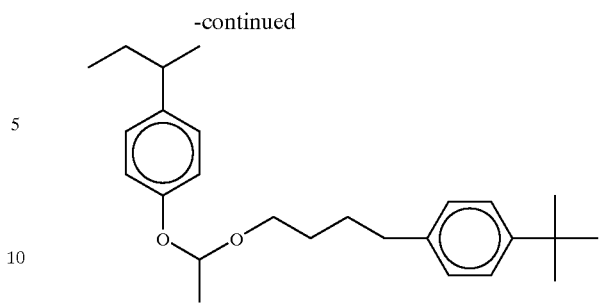
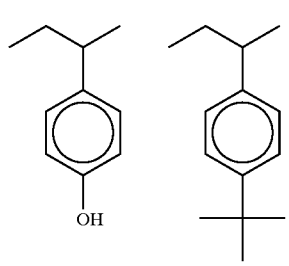
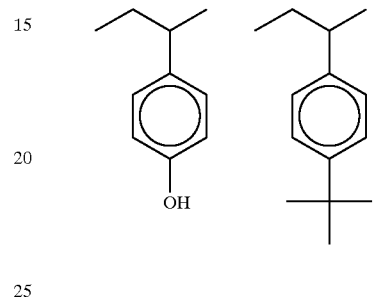
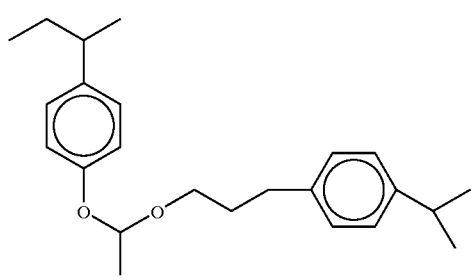
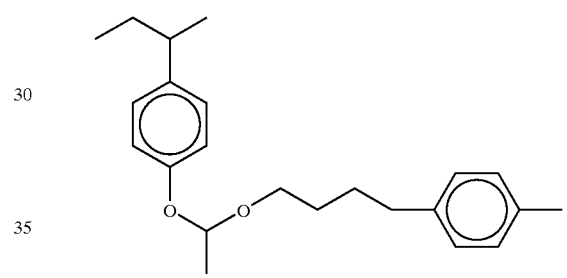
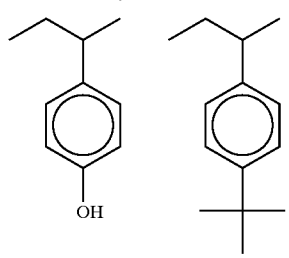
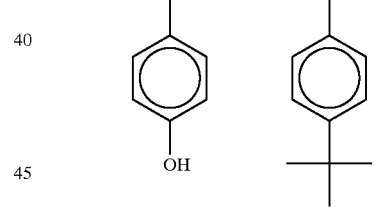
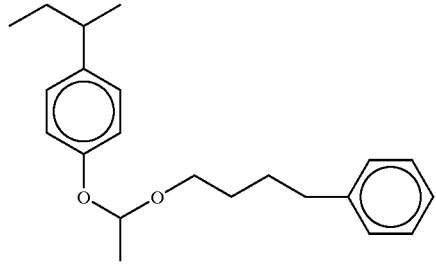
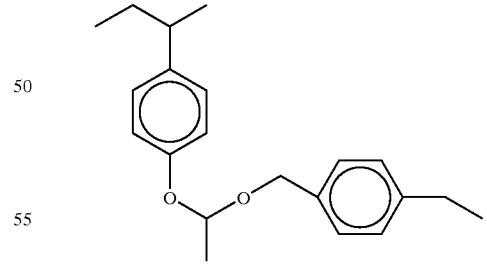
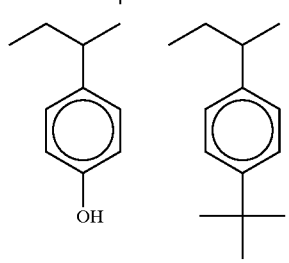
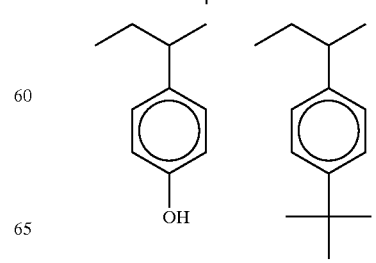

-continued
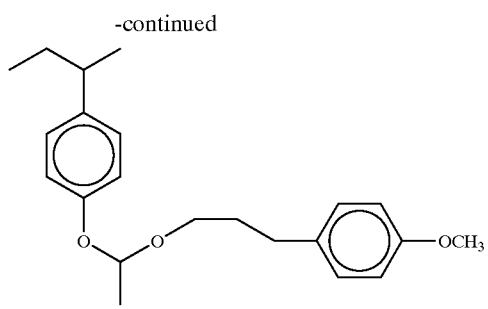
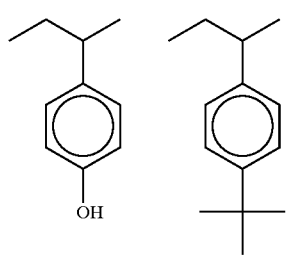
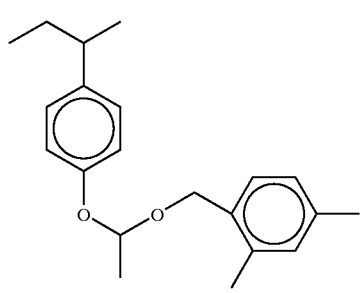
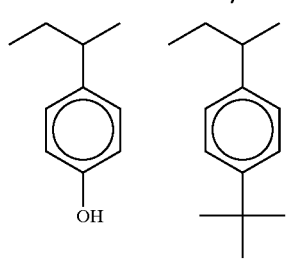
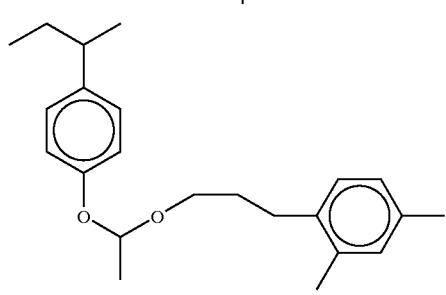
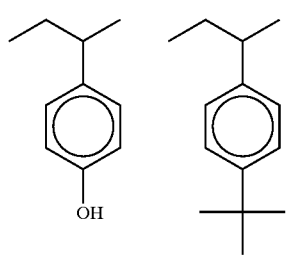
-continued
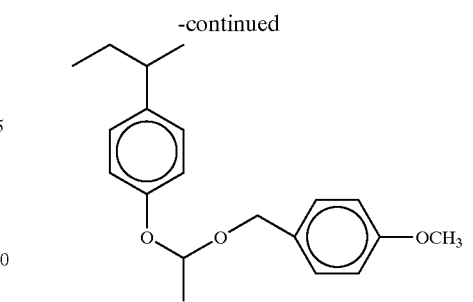
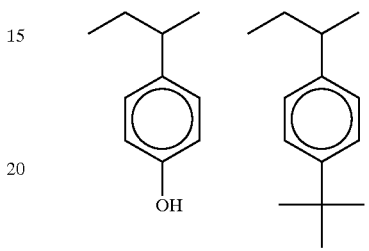
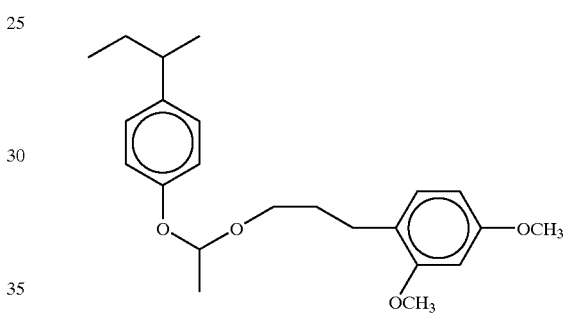
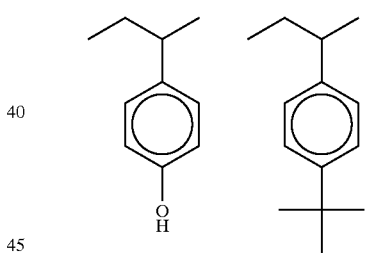
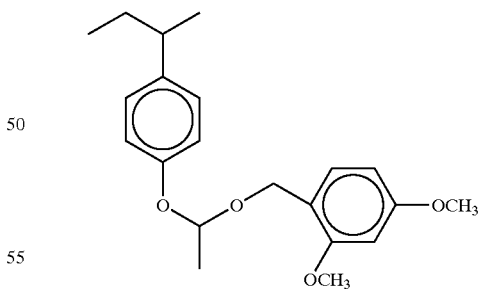
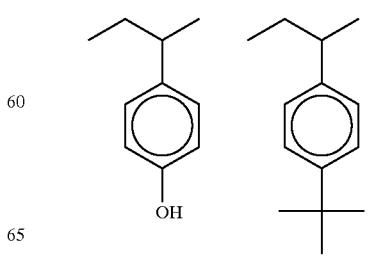

-continued
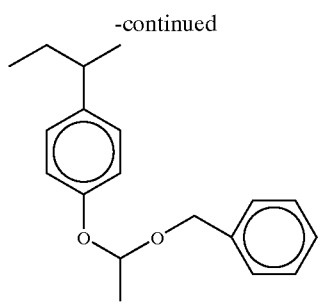
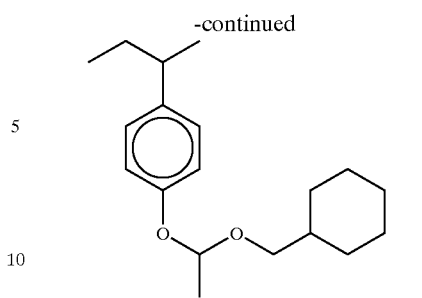
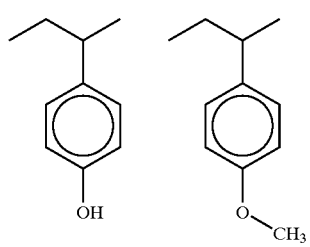
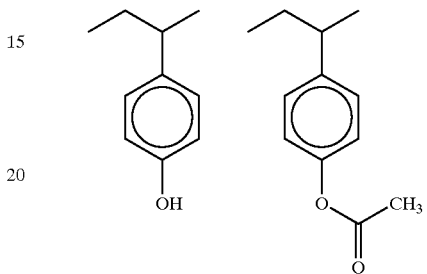
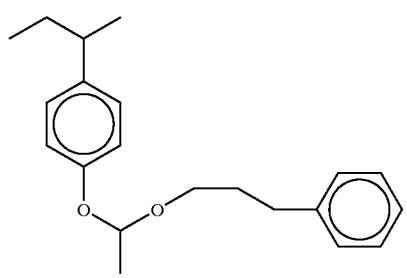
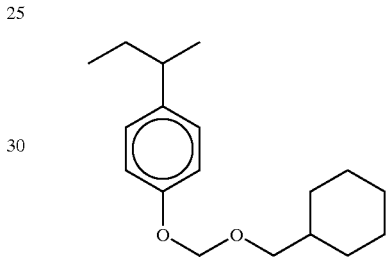
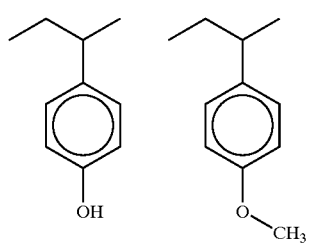
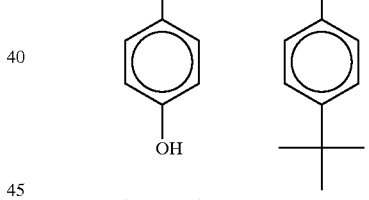
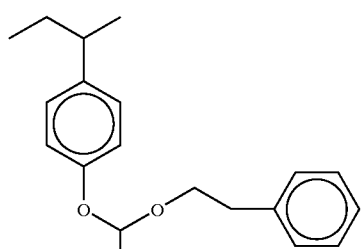
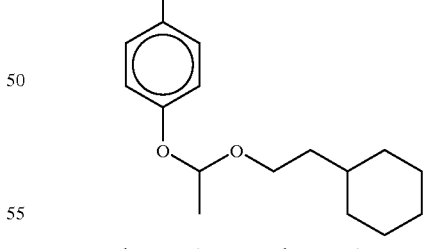
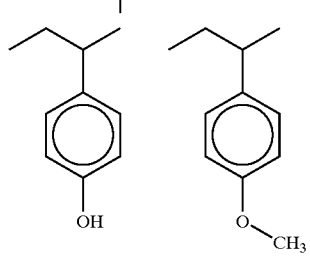
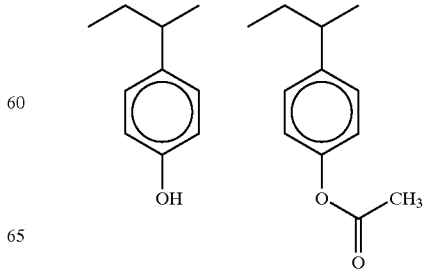

-continued

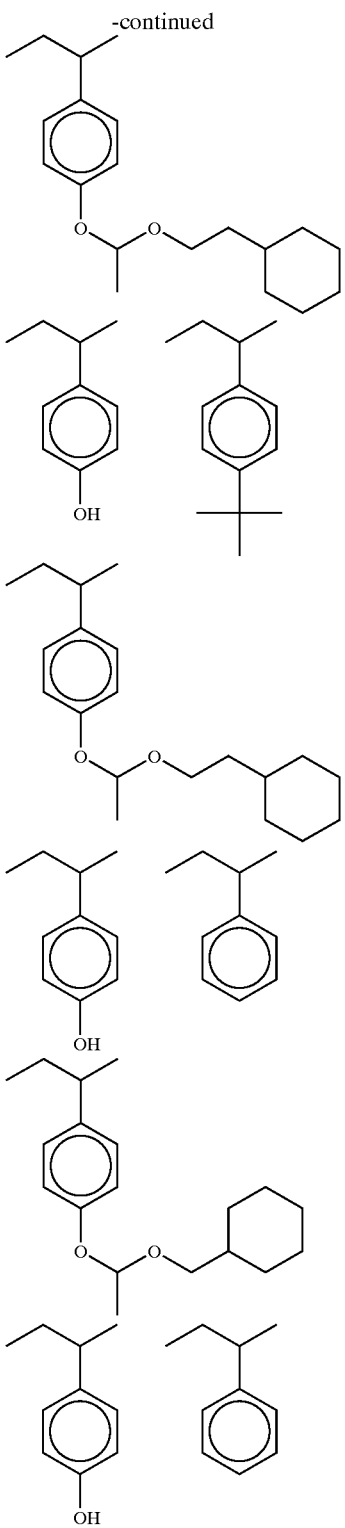

b) Resin (B) having a group represented by formula (Y) and capable of decomposing under the action of an acid to increase the solubility in an alkali developer.

In formula (Y), the lower alkyl group having from 1 to 4 carbon atoms of $R^4$ includes a methyl group, an ethyl group, an n-propyl group, an isopropyl group, an n-butyl group, an isobutyl group, a sec-butyl group and a tert-butyl group.

Specific examples of the group represented by formula (Y) are set forth below, however, the present invention is not limited thereto.

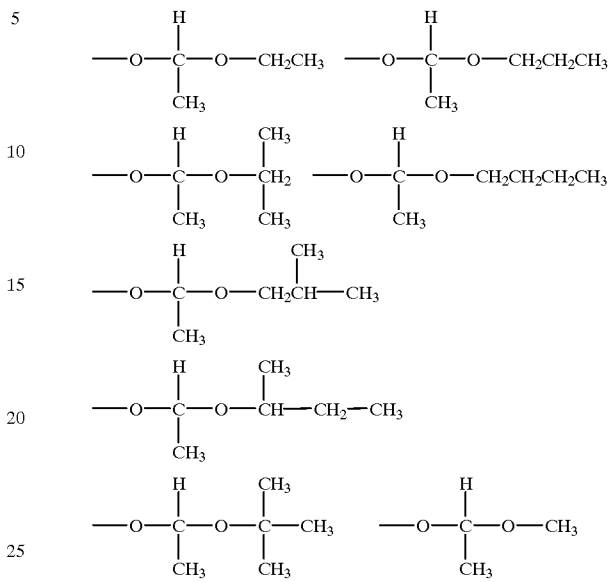

In the present invention, the resin having a group represented by formula (Y) and capable of decomposing under the action of an acid to increase the solubility in an alkali developer (hereinafter sometimes referred to a resin having a group represented by formula (Y)) is a compound having a structure such that an acid-decomposable group represented by formula (Y) is introduced into a compound obtained by polymerizing a monomer and having a molecular weight distribution, and capable of becoming alkali-soluble under the action of an acid.

The resin having a group represented by formula (Y) is a resin having a group represented by formula (Y) on the main or side chain or on both main and side chains of the resin. Among these, a resin having a group represented by formula (Y) on the side chain is preferred.

In the case where the group represented by formula (Y) is bonded as a side chain, the mother moiety resin is preferably an alkali-soluble resin having a —OH or —COOH group, preferably a —$R^0$—COOH or —Ar—OH group on the side chain (wherein —$R^0$— represents a divalent or greater valence aliphatic or aromatic hydrocarbon which may have a substituent, and —Ar— represents a divalent or greater valence aromatic group which may have a polycyclic substituent).

In the present invention, the mother moiety resin is preferably an alkali-soluble resin having a phenolic hydroxyl group.

The alkali-soluble resin having a phenolic hydroxyl group for use in the present invention is preferably a copolymer containing at least 30 mol %, preferably 50 mol % or more of a repeating unit corresponding to o-, m- or p-hydroxystyrene (these are collectively called "hydroxystyrene") or o-, m- or p-hydroxy-α-methylstyrene (these are collectively called "hydroxy-α-methylstyrene), a homopolymer thereof or a resin where the benzene nucleus of this unit is partially hydrogenated, more preferably a p-hydroxystyrene homopolymer.

Other than hydroxystyrene and hydroxy-α-methylstyrene, preferred examples of the monomer for the copolymerization of the copolymer include acrylic acid esters, methacrylic acid esters, acrylamides, methacrylamides, acrylonitrile, methacrylonitrile, maleic anhydride, styrene, α-methylstyrene, acetoxystyrene and alkoxystyrenes. Among these, styrene, acetoxystyrene and tert-butoxystyrene are more preferred.

In the present invention, the content of the repeating unit (structural unit) having a group represented by formula (Y) in the resin is preferably 5 to 70 mol %, more preferably from 5 to 50 mol %, based on all repeating units.

In the present invention, the resin having a group represented by formula (Y) may contain other acid-decomposable group in addition to the group represented by formula (Y).

The resin having a group represented by formula (Y) may be obtained by synthesizing a corresponding vinyl ether and reacting it with a phenolic hydroxyl group-containing alkali-soluble resin dissolved in an appropriate solvent such as tetrahydrofuran according to a known method. The reaction is performed in the presence of a normal acidic catalyst, preferably, an acidic ion exchange resin, a hydrochloric acid, a p-toluene sulfonic acid or a salt such as pyridinium tosylate. The corresponding vinyl ether may be synthesized from an active starting material such as chloroethyl vinyl ether by a method such as nucleophilic substitution reaction or may be synthesized using mercury or palladium catalyst.

The corresponding vinyl ether may also be synthesized by another method of performing acetal exchange using corresponding alcohol and vinyl ether. In this case, the acetal exchange is performed in the presence of an acid such as p-toluenesulfonic acid or pyridinium tosylate while letting an alcohol to carry a substituent intended to introduce and using vinyl ether in which a relatively unstable vinyl ether such as t-butyl vinyl ether is mixed.

Specific examples of the structure of the resin having a group represented by formula (Y) are set froth below, however, the present invention is not limited thereto.

B'

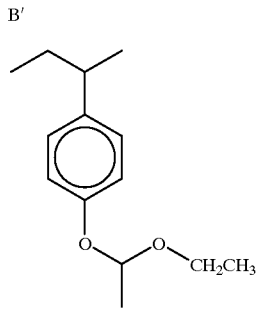 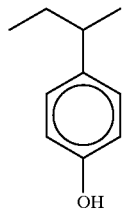

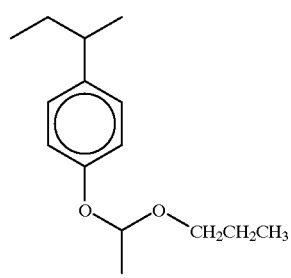 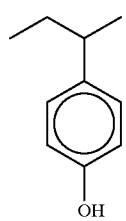

-continued

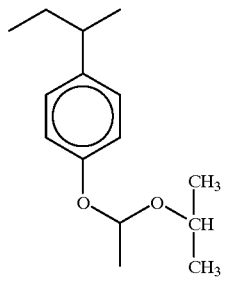 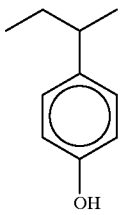

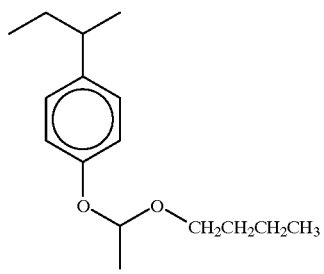 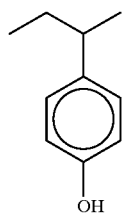

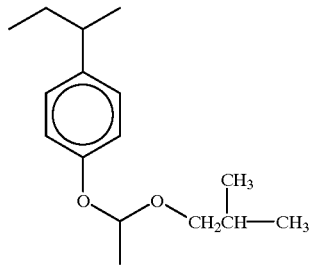 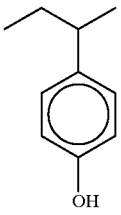

B'

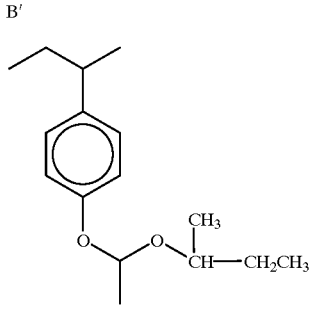 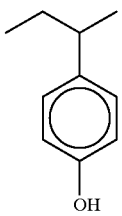

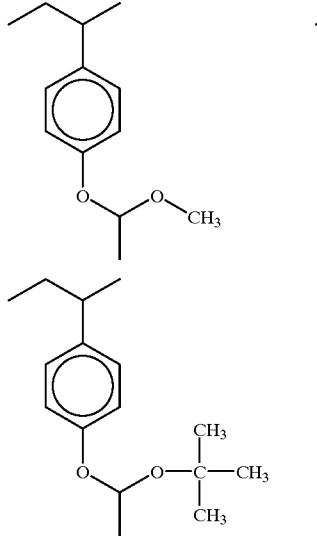 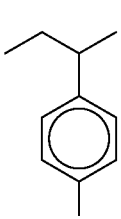

(b)-2: The resin (B') having structural units represented by the following formulae (IV), (V) and (VI) and capable of decomposing under the action of an acid to increase the solubility in an alkali developer.

$R^6$ represents a hydrogen atom or a methyl group.

Specific examples of the linear alkyl group, branched alkyl group, cyclic alkyl group, aryl group and aralkyl group of $R^7$ include those exemplified for $R^3$ of formula (X).

The substituent W' in formula (IV) is the same as formula (Y), and formula (Y) is as described above.

Specific examples of the structure of the structural unit represented by formula (IV) are set forth below, however, the present invention is not limited thereto.

B''IV

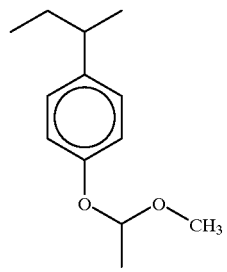
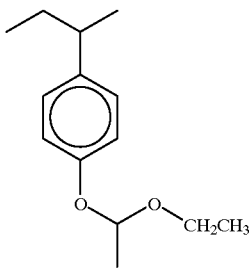

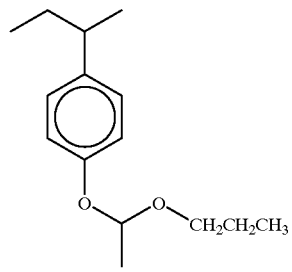

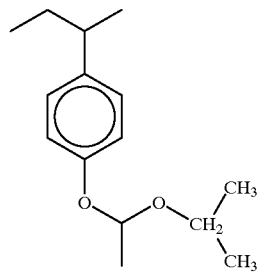

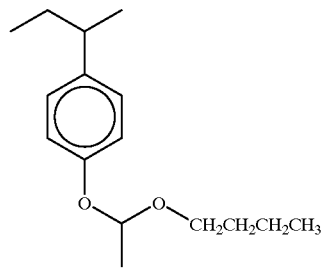

-continued

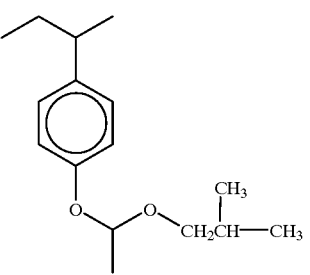

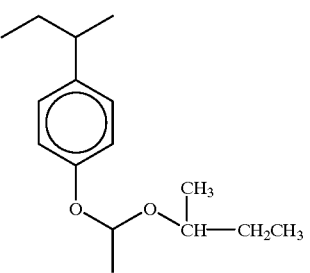

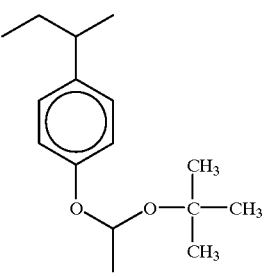

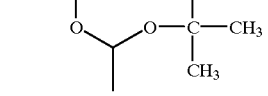

By incorporating the structural unit represented by formula (VI) into a resin can decompose under the action of an acid and can be controlled in the solubility in an alkali developer. Furthermore, by introducing this structural unit, a profile having excellent rectangularity can be achieved. This is also effective in adjusting the amount of the structural unit represented by formula (IV)

Specific examples of the polymerizable monomer of the structural unit represented by formula (VI) are set forth below, however, the invention is not limited thereto.

B'δVI

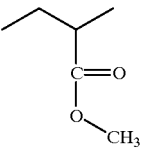
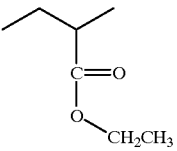

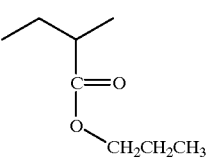
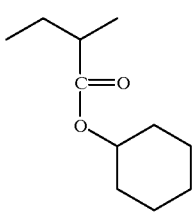

-continued

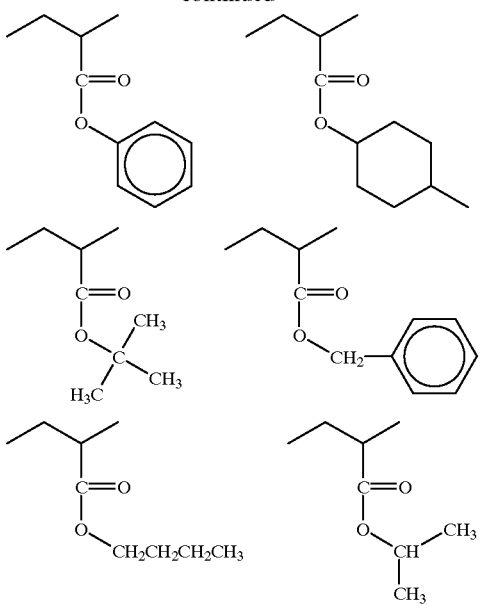

The resin containing the structural units represented by formulae (IV), (V) and (VI) can be obtained, for example, by reacting a phenolic resin or a monomer thereof with an acid anhydride or a corresponding halide in the presence of a base.

In the present invention, the resin (B') capable of decomposing under the action of an acid to increase the solubility in an alkali developer may contain other monomer unit as a copolymerization component, in addition to the structural units represented by formulae (IV), (V) and (VI).

In the resin (B') capable of decomposing under the action of an acid to increase the solubility in an alkali developer, the ratio among x', y' and z' preferably satisfies the following conditions:
when z'=0,
0.05<x'/(x'+y')<0.5, preferably 0.1<x'/(x'+y')<0.45,
when z'>0,
(i) 0.10<x'/(x'+y'+z')<0.50, (ii) 0.005<z'/(x'+y'+z')<0.35, (iii) x'>z', and (iv) 0.4<x'/(x'+z')<0.95,
preferably
(i) 0.20<x'/(x'+y'+z')<0.40, (ii) 0.01<z'/(x'+y'+z')<0.25, (iii) x'≧z', and (iv) 0.5<x'/(x'+z')<0.85.

By satisfying these conditions, the resin of the present invention is improved in the rectangularity of profile, particularly, more improved in the development defect.

The repeating structural units represented by formulae (IV), (V) and (V) and the repeating structural unit from other polymerizable monomer each may be used individually or in combination of two or more thereof and allowed to be present in the resin.

In the resin contained in the positive photosensitive composition of the present invention, an appropriate other polymerizable monomer may be copolymerized to introduce an alkali-soluble group such as phenolic hydroxyl group or carboxyl group, so as to maintain good developability for an alkali developer.

The molecular weight of the resin B (including the rein B') is in terms of the weight average molecular weight (Mw, polystyrene base) 2,000 or more, preferably from 3,000 to 200,000, more preferably from 5,000 to 70,000. The dispersion degree (Mw/Mn) is preferably from 1.0 to 4.0, more preferably from 1.0 to 3.5, still more preferably from 1.0 to 3.0. As the dispersion degree is smaller, the heat resistance and image-forming properties (e.g., pattern profile, defocus latitude) are better.

The content of the resin B (including the resin B') in the positive photosensitive composition (excluding a coating solvent) is preferably from 50 to 99 wt %, more preferably from 70 to 97 wt %.

Specific examples of the resin having repeating structural units represented by formulae (IV), (V) and (VI) are set forth below, however, the present invention is not limited thereto.

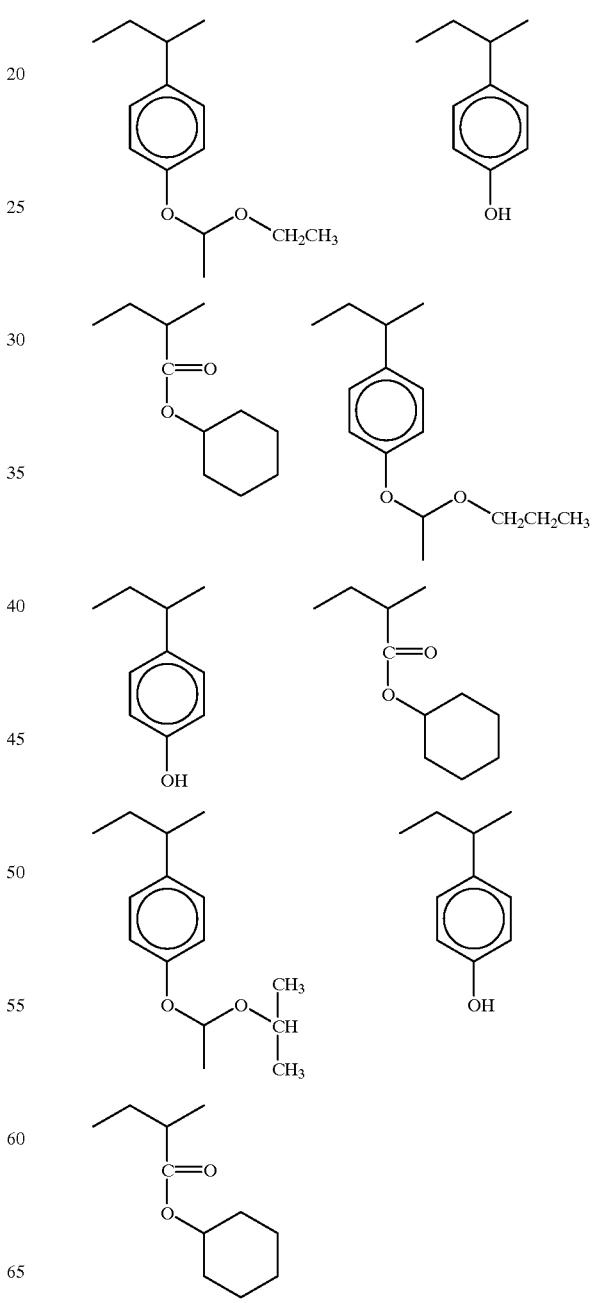

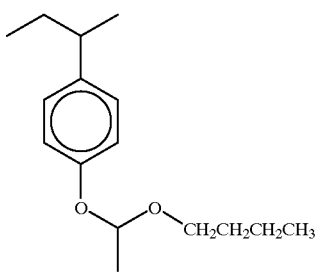 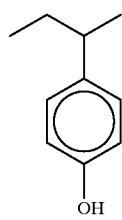
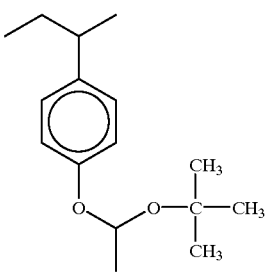 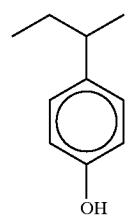
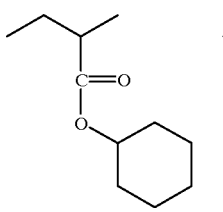 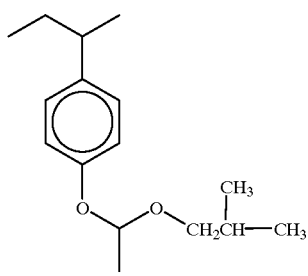
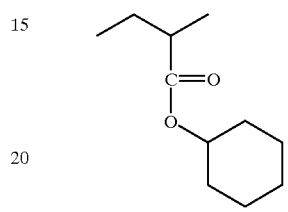
B'
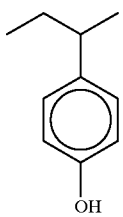 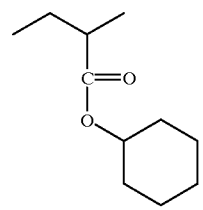
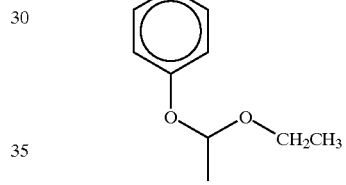 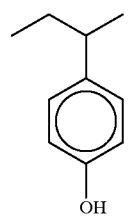
B'
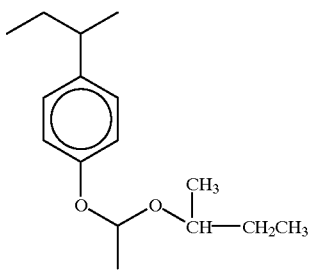 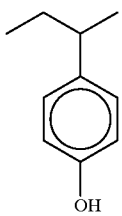
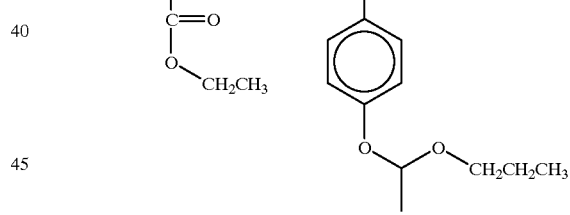
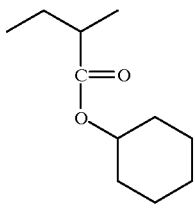 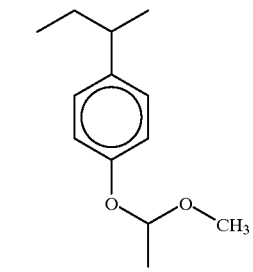
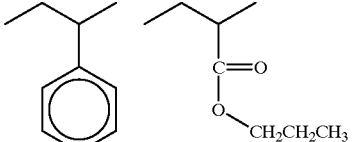
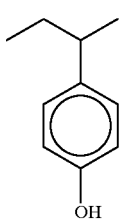 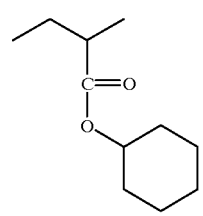
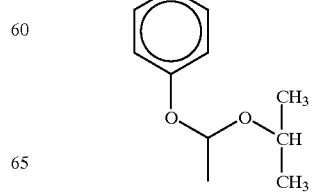 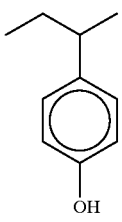

-continued

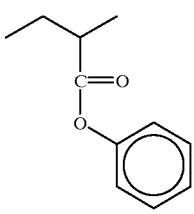
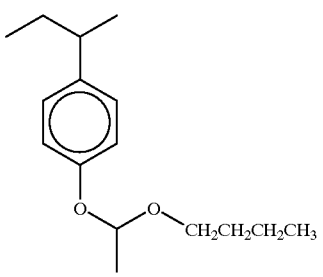
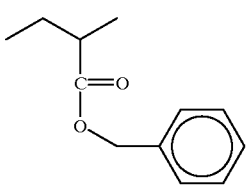
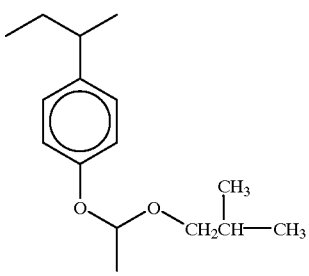
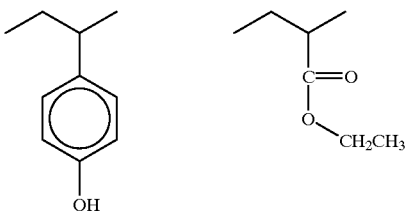

B'

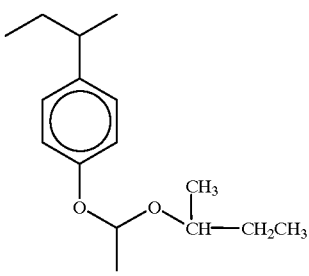
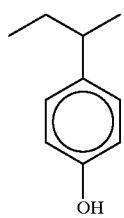

-continued

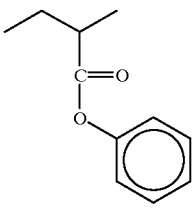
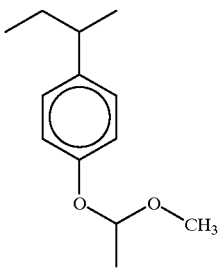
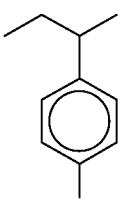
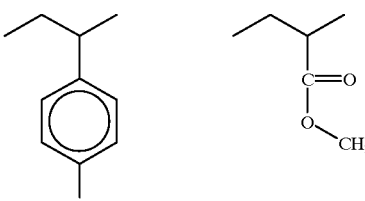
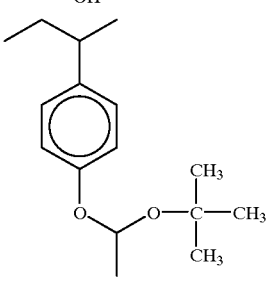
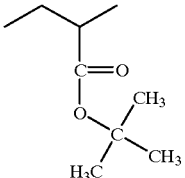

In the present invention, the mixing ratio of Resins (A) and (B) each capable of decomposing under the action of an acid to increase the solubility in an alkali developer is:

$0.1 \leq (A)/\{(A)+(B)\} \leq 0.9$ (by weight), preferably $0.2 \leq (A)/\{(A)+(B)\} \leq 0.8$ (by weight), and more preferably $0.3 \leq (A)/\{(A)+(B)\} \leq 0.7$ (by weight).

If the ratio of the resin (A) is less than 10%, the dry etching resistance and image performance (e.g., pattern profile, defocus latitude) deteriorate and if the ratio of the resin (B) is less than 10%, the shortening performance deteriorates.

<(b) Compound capable of generating an acid upon irradiation with actinic rays or radiation (photo-acid generator)>

The photo-acid generator (b) for use in the present invention is a compound capable of generating an acid upon irradiation with actinic rays or radiation.

The photo-acid generator for use in the present invention may be appropriately selected from photocationic polymerization initiators, photoradical polymerization initiators, photo-decoloring agents for dyes, photo-discoloring agents, compounds capable of generating an acid upon irradiation with a known ray used for a microresist or the like (for example, ultraviolet or far ultraviolet ray of 200 to 400 nm, preferably g-line, h-line, i-line and KrF excimer laser ray), an ArF excimer laser ray, an electron beam, an X ray, a molecular beam or an ion beam, and a mixture thereof.

Other examples of the photo-acid generator for use in the present invention include onium salts such as diazonium salt, ammonium salt, phosphonium salt, iodonium salt, sulfonium salt, selenonium salt and arsonium, organic halogen compounds, organic metals/organic halides, photo-acid generators having an o-nitrobenzyl type protective group, compounds which photochemically decompose to generate sulfonic acid, represented by iminosulfonate, disulfone compounds, and diazoketosulfone and diazosulfone compounds.

In addition, compounds in which the above-described group or compound capable of generating an acid by light is introduced in the main chain or side chain may also be used Furthermore, the compounds capable of generating an acid by light described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, European Patent 126,712, etc. may also be used.

Among these photo-acid generators, particularly effective compounds are described below.

(1) Oxazole derivative represented by formula (PAG1) and S-triazine derivative represented by formula (PAG2), substituted by trihalomethyl group:

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or —C(Y)$_3$, and Y represents chlorine atom or bromine atom.

Specific examples thereof include the following compounds, however, the present invention is not limited thereto.

-continued
(PAG2-3)
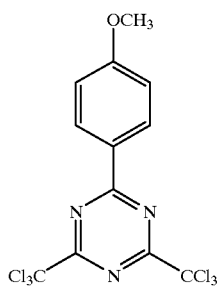
(PAG2-4)
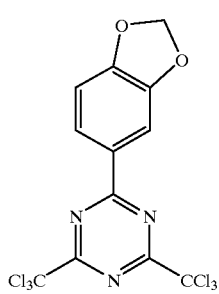
(PAG2-5)
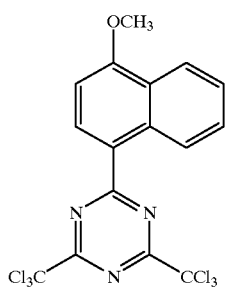
(PAG2-6)
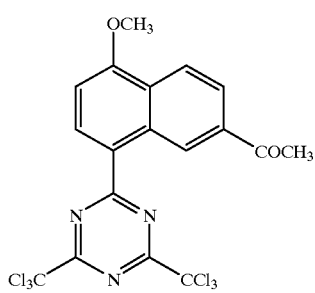
(PAG2-7)
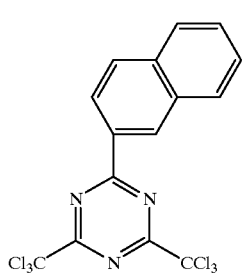
-continued
(PAG2-8)
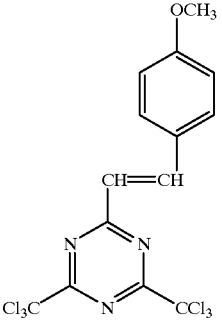
(PAG2-9)
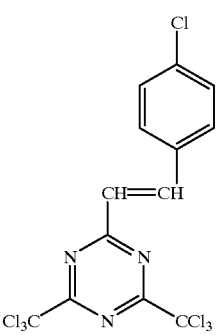
(PAG2-10)
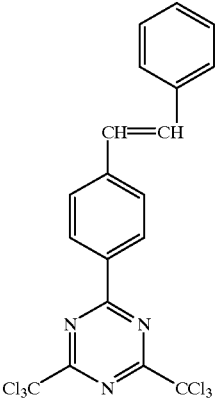
(2) Iodonium salt represented by formula (PAG3) and sulfonium salt represented by formula (PAG4):
(PAG3)
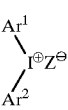
(PAG4)
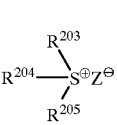
wherein $Ar^1$ and $Ar^2$ each independently represents a substituted or unsubstituted aryl group, $R^{203}$, $R^{204}$ and $R^{205}$ each independently represents a substituted or unsubstituted alkyl group, or a substituted or unsubstituted aryl group, and Z⁻ represents a counter anion (for example, $BF_4^-$, $AsF_6^-$, $PF_6^-$, $SbF_6^-$, $SiF_6^{2-}$, $ClO_4^-$; perfluoroalkane sulfonate anion such as $CF_3SO_3^-$; alkylsulfonate anion such as camphor sulfonate anion; aromatic sulfonate anion such as pentafluorobenzene sulfonate anion, benzenesulfonate anion, fluoroalkylbenzenesulfonate anion and triisopropylbenzenesulfonate anion; condensed polynuclear aromatic sulfonate anion such as naphthalene-1-sulfonate anion; anthraquinone sulfonate anion; and sulfonic acid group-containing dye, however, the anion is not limited thereto and these anions each may further have a substituent), provided that two of $R^{203}$, $R^{204}$ and $R^{205}$, or $Ar^1$ and $Ar^2$ may be combined through a single bond or a substituent.

Specific examples thereof include the following compounds, however, the present invention is not limited thereto.

(PAG3-1)
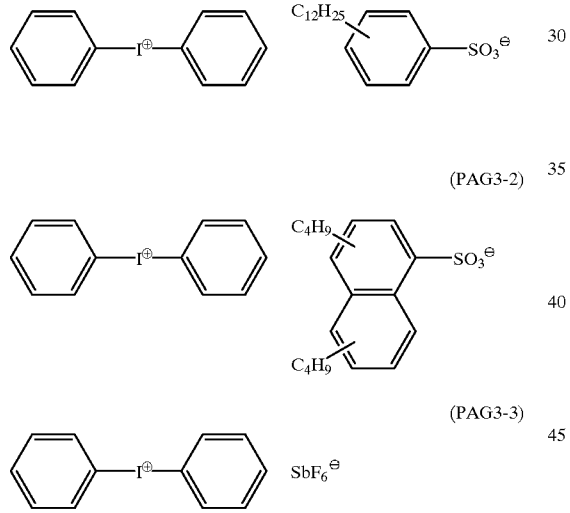

(PAG3-2)

(PAG3-3)

(PAG3-4)

(PAG3-5)
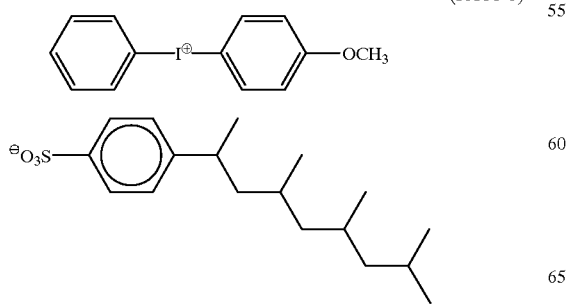

(PAG3-6)
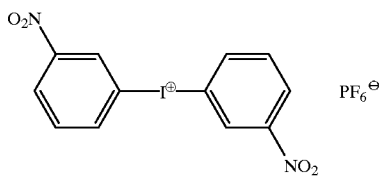

(PAG3-7)
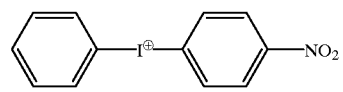

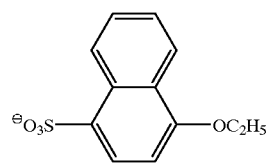

(PAG3-8)
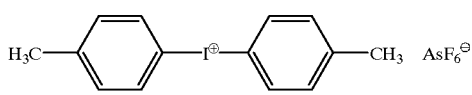

(PAG3-9)
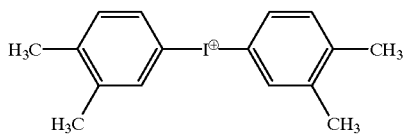

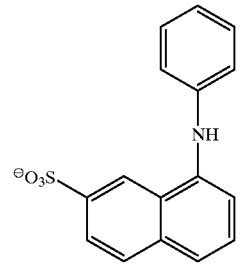

(PAG3-10)
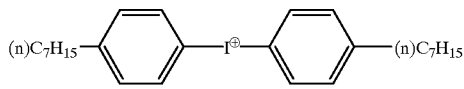

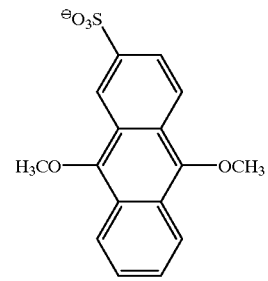

(PAG3-11)
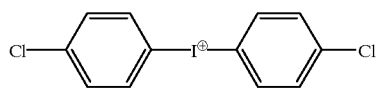
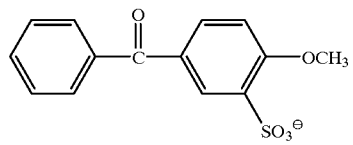
(PAG3-12)
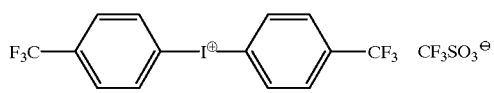 CF₃SO₃⁻
(PAG3-13)
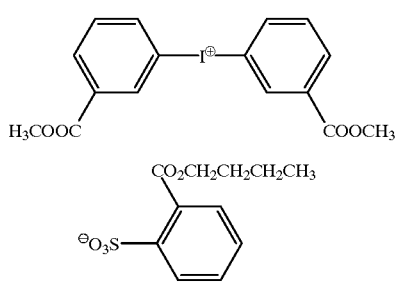
(PAG3-14)
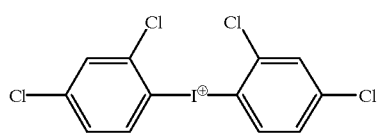
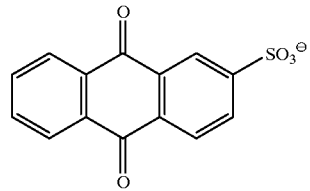
(PAG3-15)
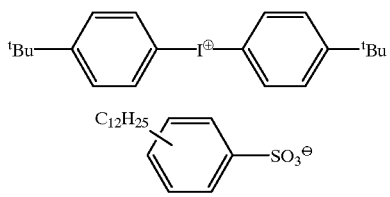
(PAG3-16)
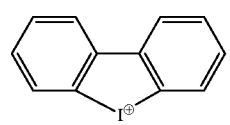
(PAG3-17)
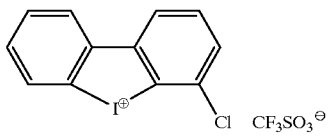 CF₃SO₃⁻
(PAG3-18)
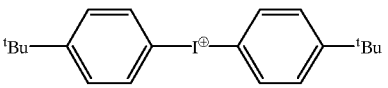
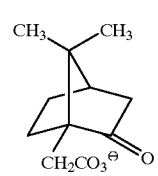
(PAG3-19)
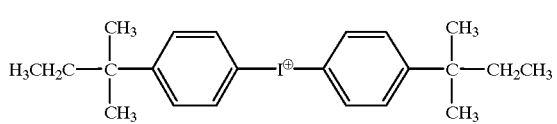
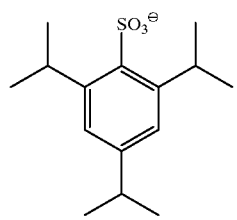
(PAG3-20)
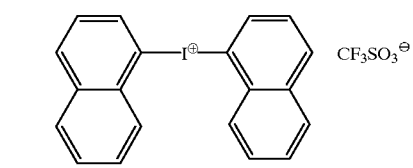 CF₃SO₃⁻
(PAG3-21)
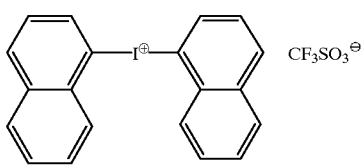
C₄F₉SO₃⁻
(PAG3-22)
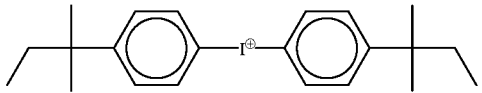
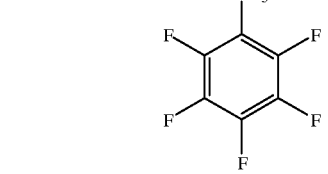

(PAG3-23)
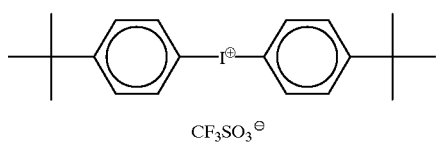
(PAG3-24)
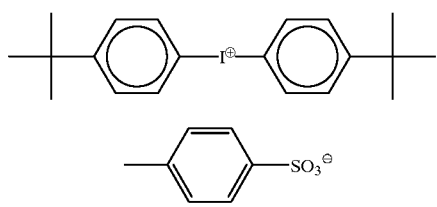
(PAG3-25)
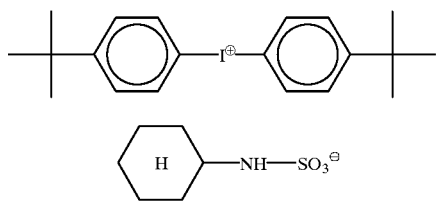
(PAG4-1)
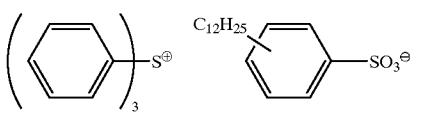
(PAG4-2)
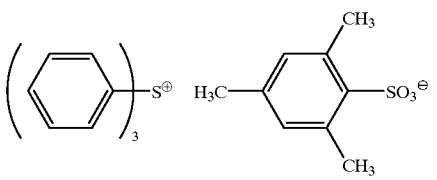
(PAG4-3)
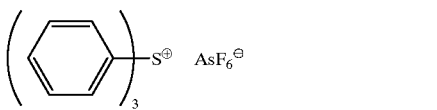
(PAG4-4)
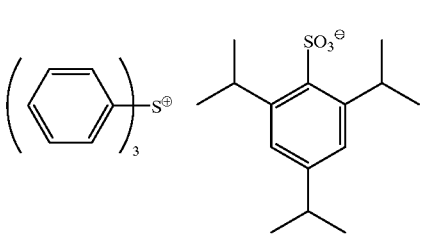
(PAG4-5)
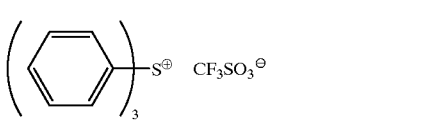
(PAG4-6)
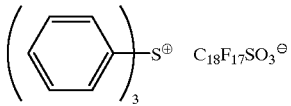
(PAG4-7)
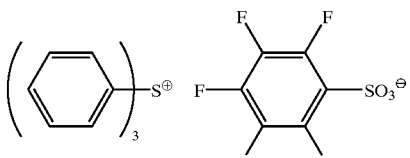
(PAG4-8)
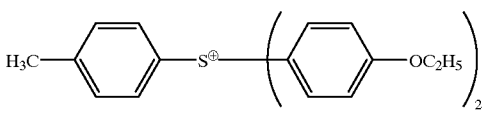
(PAG4-9)
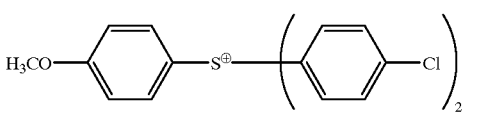
(PAG4-10)
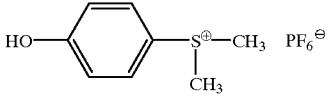
(PAG4-11)
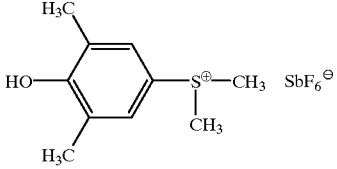
(PAG4-12)
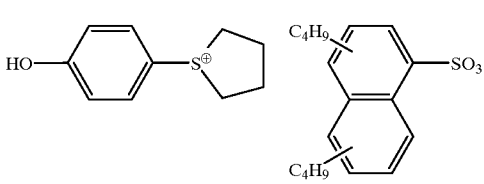
(PAG4-13)
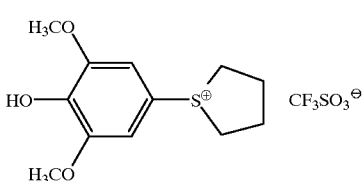
(PAG4-14)
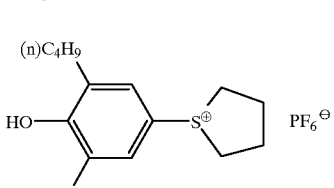

(PAG4-15)
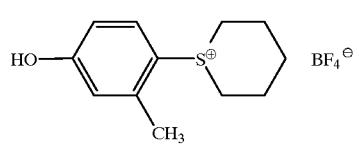
(PAG4-23)
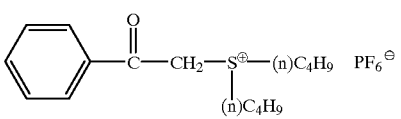
(PAG4-16)
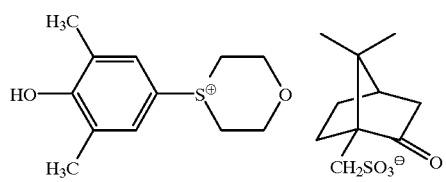
(PAG4-24)
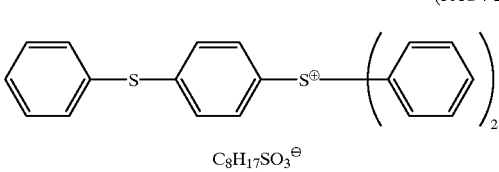
(PAG4-17)
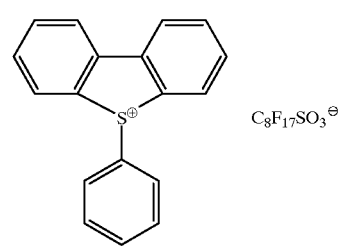
(PAG4-25)
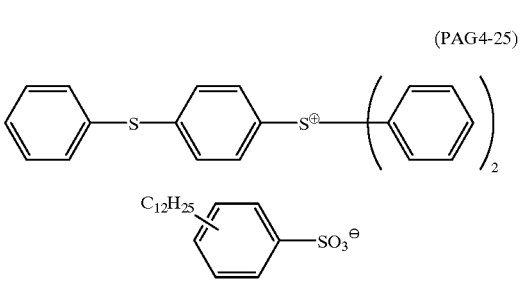
(PAG4-18)
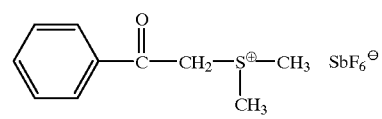
(PAG4-19)
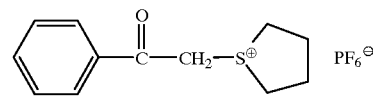
(PAG4-26)
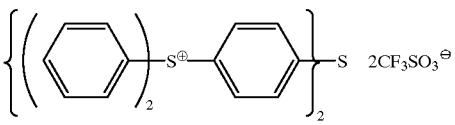
(PAG4-20)
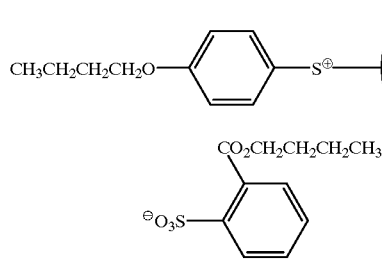
(PAG4-27)
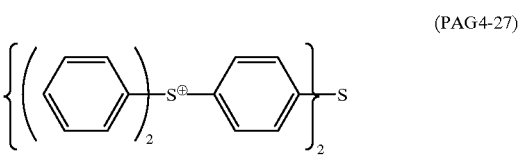
(PAG4-21)
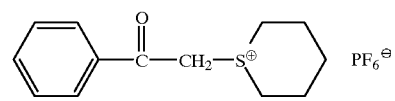
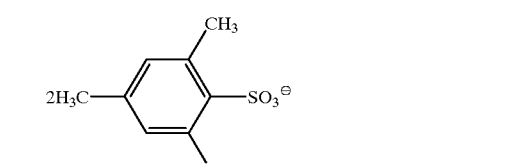
(PAG4-22)
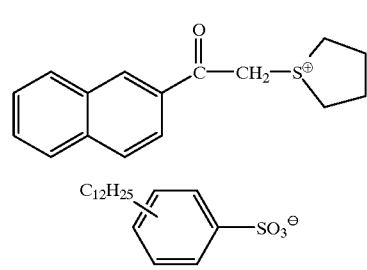
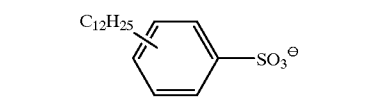
(PAG4-28)
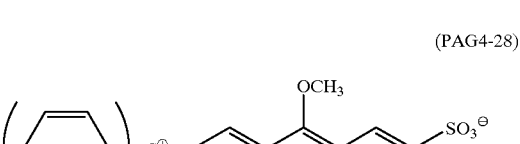
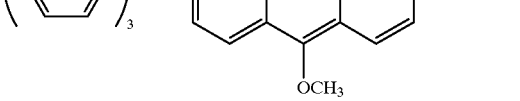
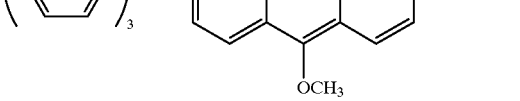

(PAG4-29)
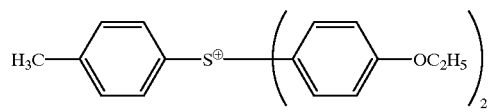
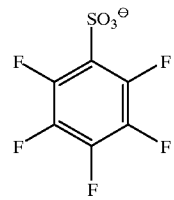
(PAG4-30)
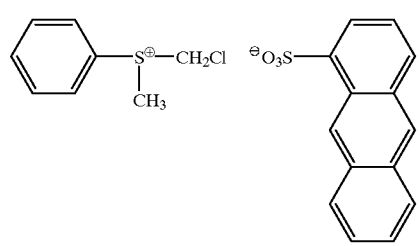
(PAG4-31)
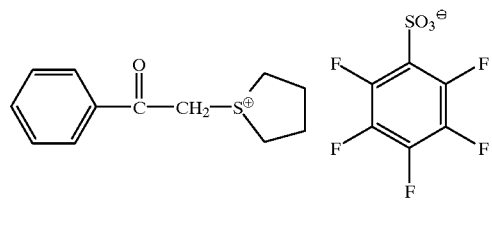
(PAG4-32)
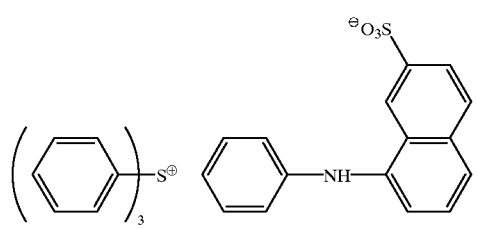
(PAG4-33)
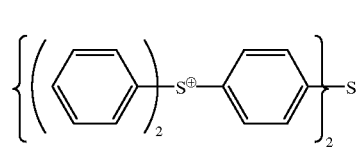
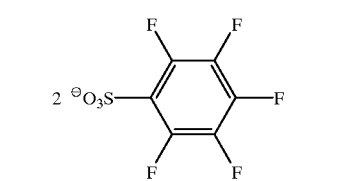
(PAG4-34)
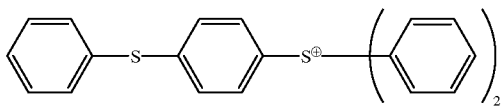
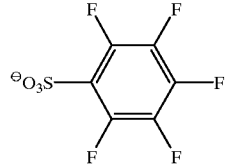
(PAG4-35)
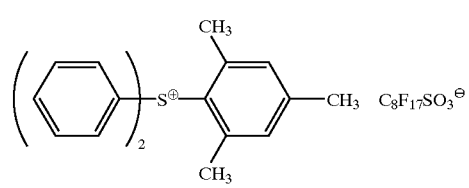
(PAG4-36)
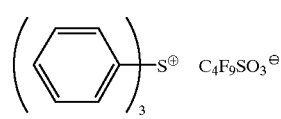
(PAG4-37)
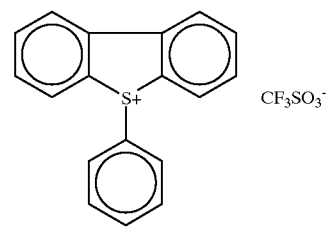
(PAG4-38)
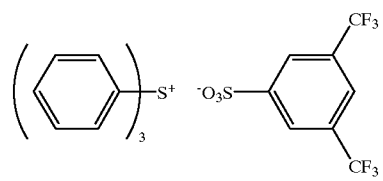
(PAG4-39)
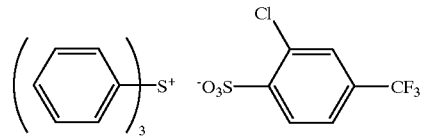
(PAG4-40)
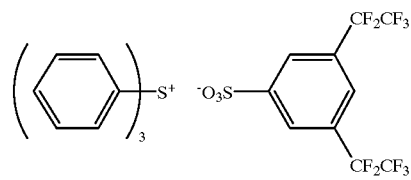

(PAG4-41) 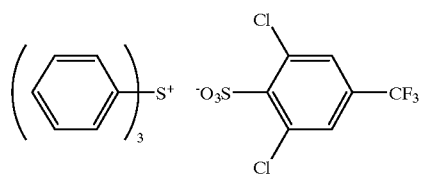
(PAG4-42) 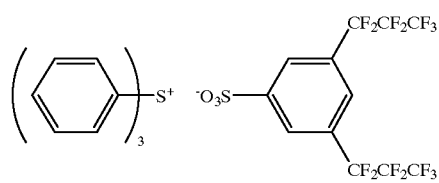
(PAG4-43) 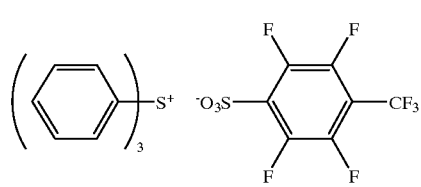
(PAG4-44) 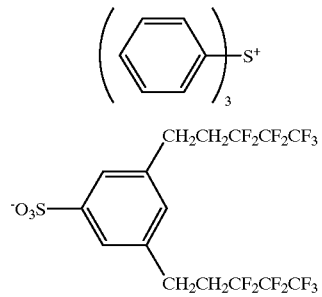
(PAG4-45) 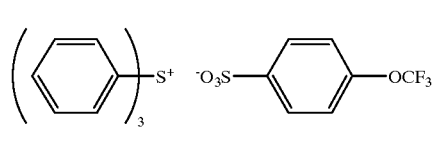
(PAG4-46) 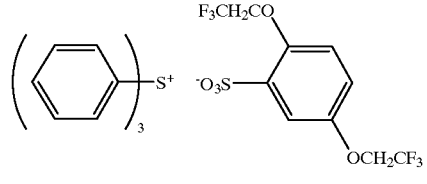
(PAG4-47) 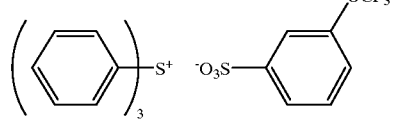
(PAG4-48) 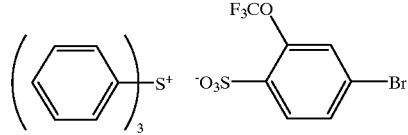
(PAG4-49) 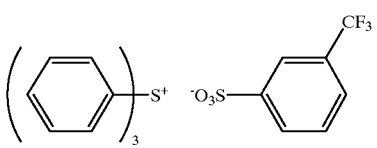
(PAG4-50) 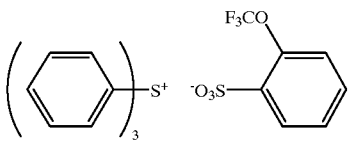
(PAG4-51) 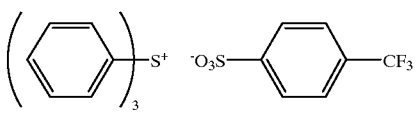
(PAG4-52) 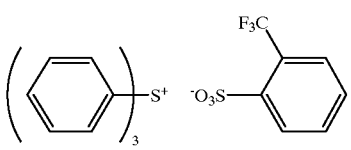
(PAG4-53) 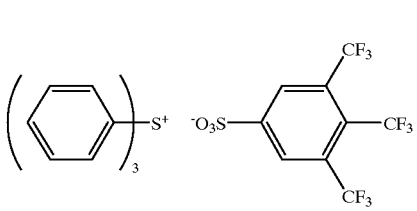
(PAG4-54) 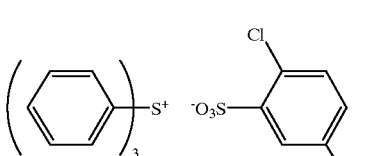
(PAG4-55) 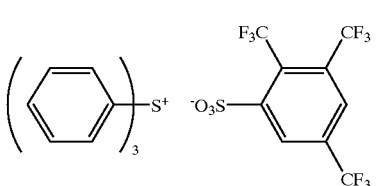
(PAG4-56) 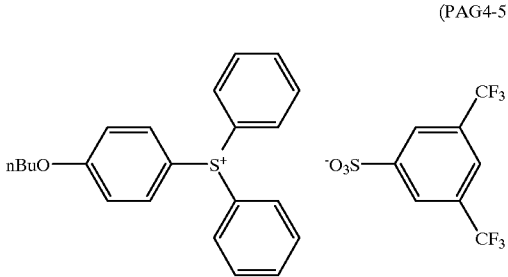

(PAG4-57)
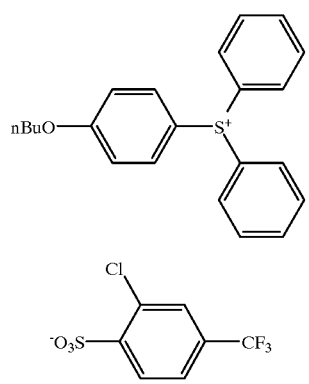
(PAG4-61)
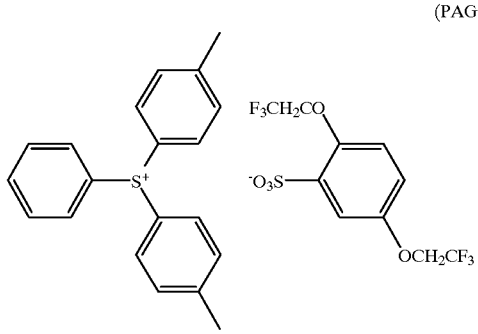
(PAG4-58)
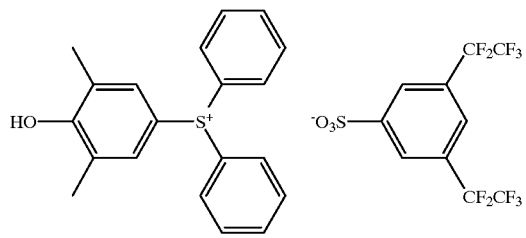
(PAG4-62)
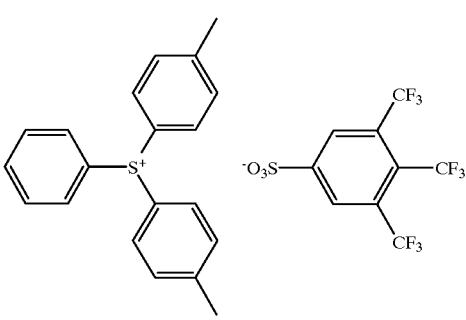
(PAG4-59)
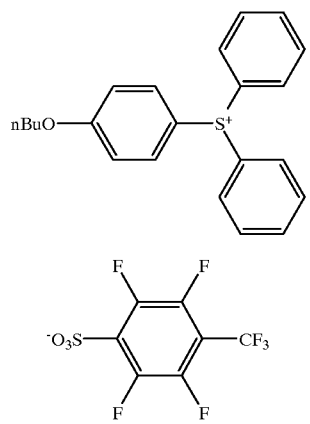
(PAG4-63)
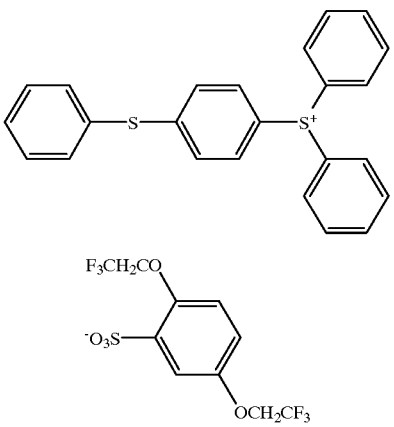
(PAG4-60)
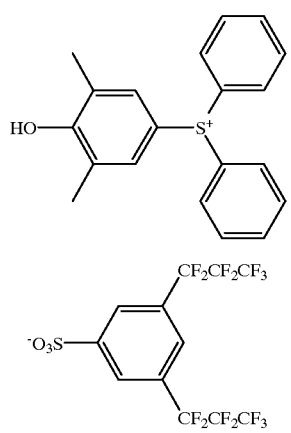
(PAG4-64)
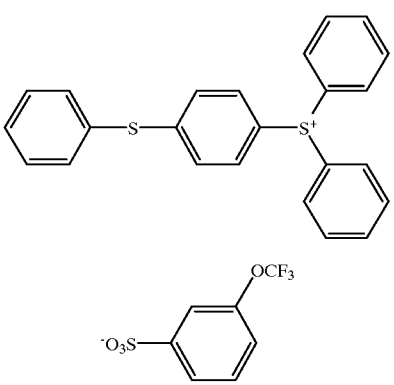

(PAG4-65)
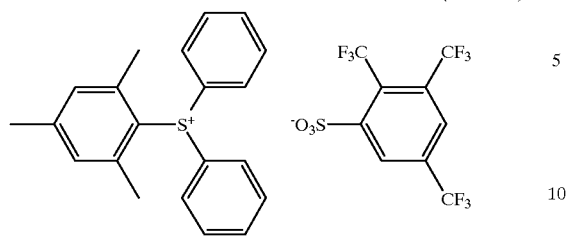
(PAG4-66)
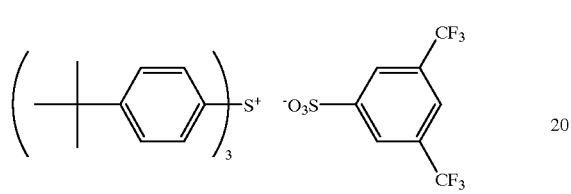
(PAG4-67)
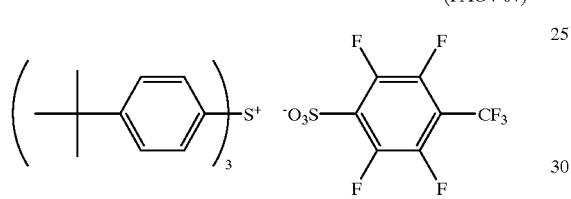
(PAG4-68)
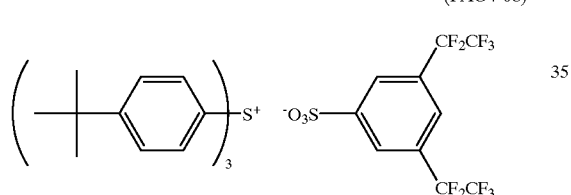
(PAG4-69)
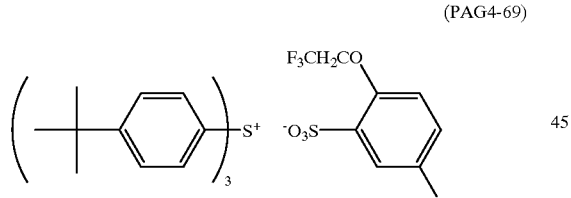
(PAG4-70)
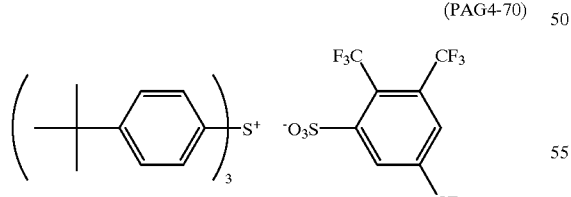
(PAG4-71)
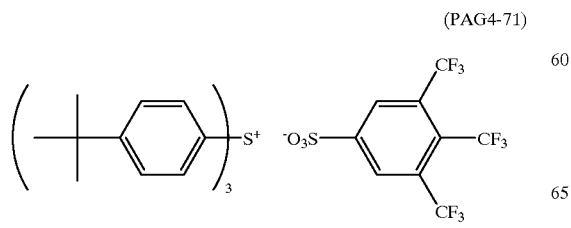
(PAG4-72)
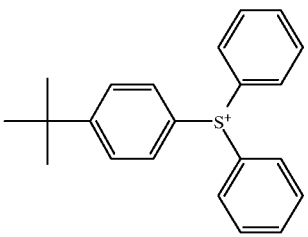
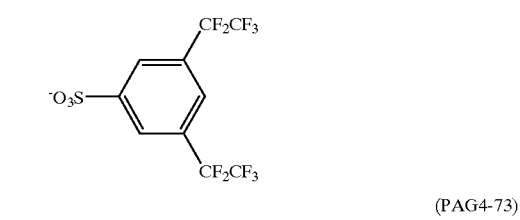
(PAG4-73)
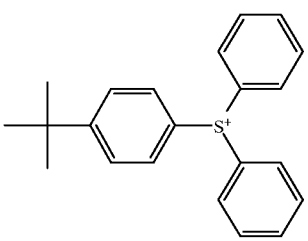
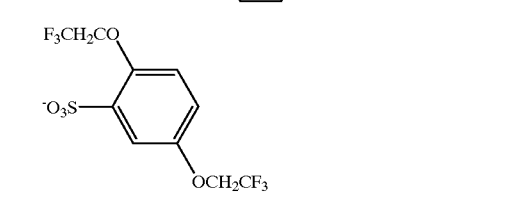
(PAG4-74)
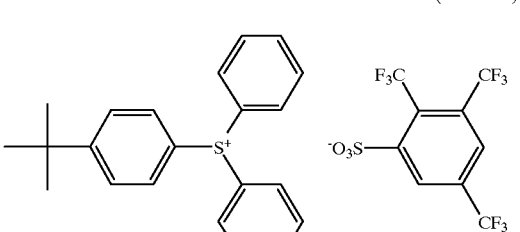
(PAG4-75)
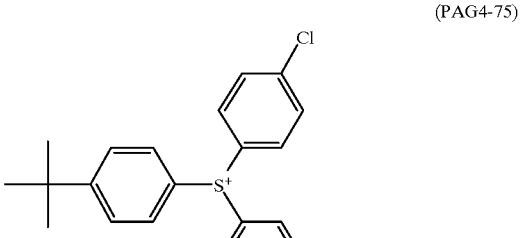
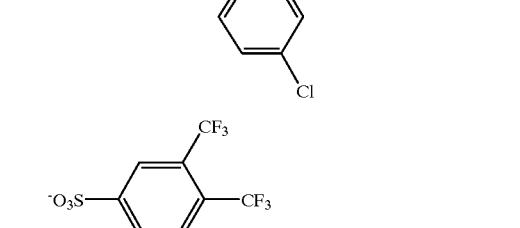

(PAG4-76)
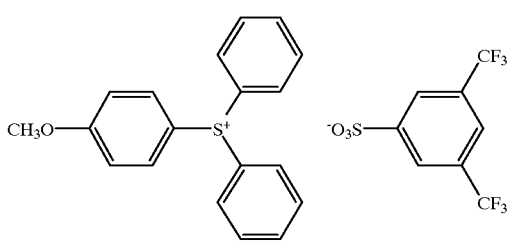

(PAG4-77)
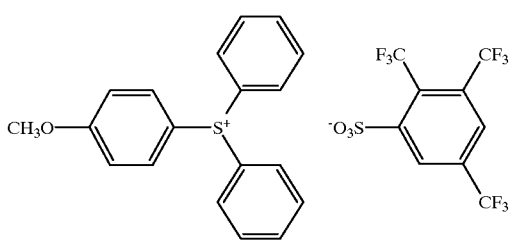

(PAG4-78)
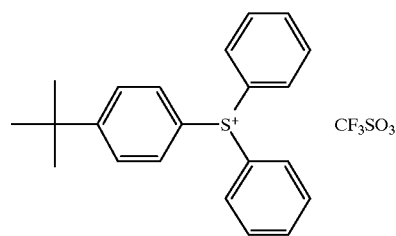

(PAG4-79)
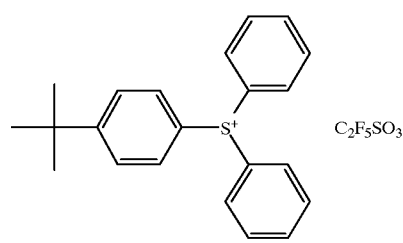

(PAG4-80)
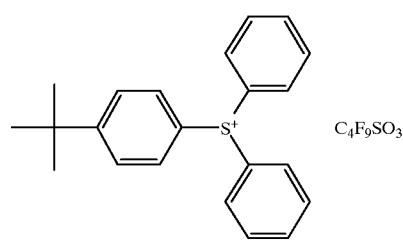

(PAG4-81)
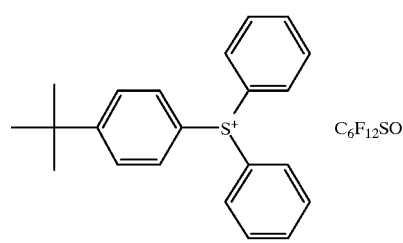

(PAG4-82)
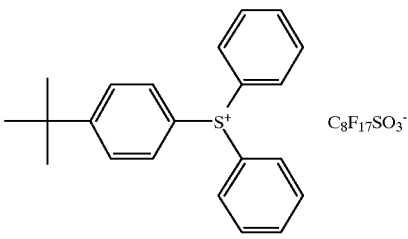

(PAG4-83)
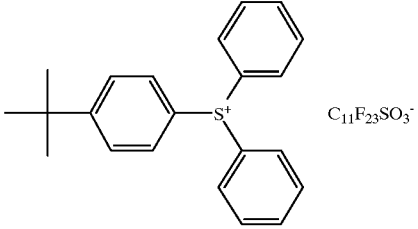

The onium salts represented by formulae (PAG3) and (PAG4) are known and can be synthesized by the method described, for example, in J. W. Knapczyl et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfonic acid derivative represented by formula (PAG5) and iminosulfonate derivative represented by formula (PAG6):

$$Ar^3-SO_2-SO_2-Ar^4 \quad \text{(PAG5)}$$

(PAG6)
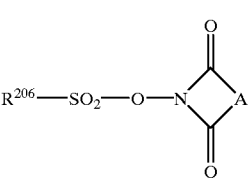

wherein $Ar^3$ and $Ar^4$ each independently represents a substituted or unsubstituted aryl group, $R^{206}$ represents a substituted or unsubstituted alkyl group or a substituted or unsubstituted aryl group, A represents a substituted or unsubstituted alkylene group, a substituted or unsubstituted alkenylene group, or a substituted or unsubstituted arylene group.

Specific examples thereof include the following compounds, however, the present invention is not limited thereto.

(PAG5-1)
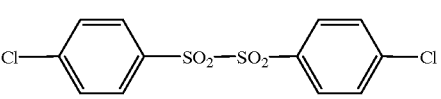

-continued (PAG5-2)

(PAG5-3)

(PAG5-4)

(PAG5-5)

(PAG5-6)

(PAG5-7)

(PAG5-8)

(PAG5-9)

(PAG5-10)

-continued (PAG5-11)

(PAG5-12)

(PAG5-13)

(PAG5-14)

(PAG5-15)

(PAG6-1)

(PAG6-2)

(PAG6-3)

(PAG6-4), (PAG6-5), (PAG6-6), (PAG6-7), (PAG6-8), (PAG6-9), (PAG6-10), (PAG6-11), (PAG6-12), (PAG6-13), (PAG6-14), (PAG6-15), (PAG6-16), (PAG6-17), (PAG6-18)

(PAG6-19)

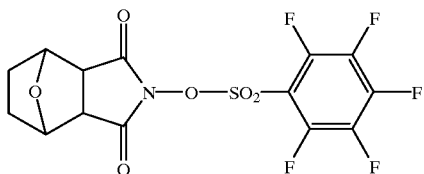

(PAG6-20)

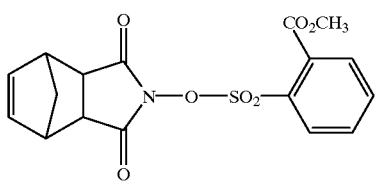

(4) Diazodisulfone derivative represented by formula (PAG7)

(PAG7)

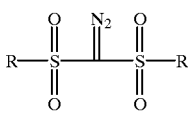

wherein R represents a linear, branched or cyclic alkyl group or an aryl group which may be substituted.

Specific examples thereof include the following compounds, however, the present invention is not limited thereto.

(PAG7-1)

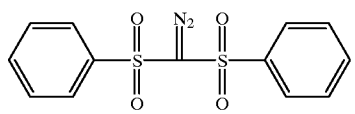

(PAG7-2)

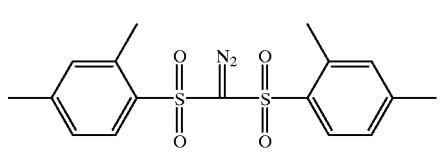

(PAG7-3)

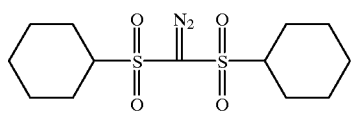

(PAG7-4)

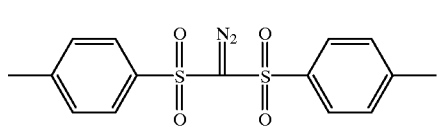

(PAG7-5)

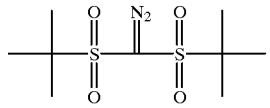

The compound (b) capable of generating an acid upon irradiation with actinic rays or radiation is preferably at least one of the compound having a sulfonium salt structure and the compound having a diazodisulfone structure. More preferably, the compound having a sulfonium salt structure and the compound having a diazodisulfone structure both are used in combination. By this, the effect of the present invention can be more remarkably brought out.

The amount of the photo-acid generator added is usually from 0.001 to 40 wt %, preferably from 0.01 to 20 wt %, more preferably from 0.1 to 5 wt %, based on the solid contents in the composition. If the amount of the photo-acid generator added is less than 0.001 wt %, the sensitivity decreases, whereas if the amount added exceeds 40 wt %, the light absorption by the resist excessively increases and the profile changes for the worse or the process (particularly bake) margin is disadvantageously reduced.

In the composition of the present invention, a compound capable of generating a carboxylic acid upon irradiation with actinic rays or radiation (carboxylic acid-generating compound) may be used. By using this, the aging stability is more improved, the change in line width due to PED is more reduced, and the pitch dependency is improved.

Examples of the carboxylic acid-generating compound include onium salts containing a cation described above for the photo-acid generator (preferably triphenylsulfonium cation) and a carboxylate anion. Specific examples thereof include diphenyliodonium carboxylate, triphenylsulfonium carboxylate, diphenyliodoniumbenzene carboxylate, triphenylsulfoniumbenzene carboxylate, and these compounds into which a substituent is introduced. Among these, preferred are triphenylsulfonium carboxylate and triphenylsulfonium-substituted benzene carboxylate.

The amount of the carboxylic acid-generating compound added in the composition of the present invention is usually from 0.01 to 40 wt %, preferably from 0.01 to 20 wt %, based on all solid contents of the composition.

In the composition of the present invention, hydroxamic acid compounds (e.g., BPA) may also be used.

In the composition of the present invention, an organic basic compound may be used. This compound is preferably added because the aging stability is more improved and the change in the line width due to PED is more reduced.

The organic basic compound which can be used in the present invention is preferably a compound having stronger basicity than that of phenol, more preferably a nitrogen-containing basic compound.

Preferred chemical environments include the following structures (A) to (E):

(A)

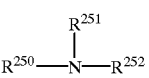

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms, an alkoxyalkyl group having from 1 to 12 carbon atoms, an alkoxyalkoxyalkyl group having from 1 to 12 carbon atoms or a substituted or unsubstituted aryl group having from 6 to 20 carbon atoms, provided that $R^{251}$ and $R^{252}$ may combine with each other to form a ring;

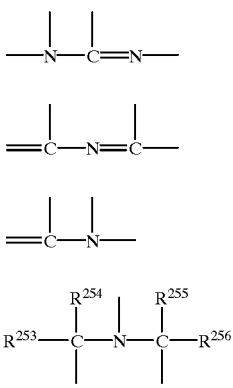

(B)

(C)

(D)

(E)

wherein $R^{253}$, $R^{254}$, $R^{255}$ and $R^{256,}$ which may be the same or different, each represents an alkyl group having from 1 to 6 carbon atoms.

The compound is preferably a nitrogen-containing cyclic compound (also called a cyclic amine compound) or a nitrogen-containing basic compound having two or more nitrogen atoms different in the chemical environment within one molecule.

The cyclic amine compound preferably has a polycyclic structure. Specific examples of the cyclic amine compound include the compound represented by the following formula (F):

(F)

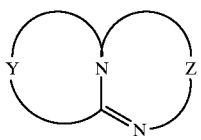

wherein Y and Z each independently represents a linear, branched or cyclic alkylene group which may contain a hetero atom and may be substituted.

Examples of the hetero atom include a nitrogen atom, a sulfur atom and an oxygen atom. The alkylene group preferably has from 2 to 10 carbon atoms, more preferably from 2 to 5 carbon atoms. Examples of the substituent of the alkylene group include an alkyl group having from 1 to 6 carbon atoms, an aryl group having from 1 to 6 carbon atoms, an alkenyl group having from 1 to 6 carbon atoms, a halogen atom and a halogen-substituted alkyl group. Specific examples of the compound represented by formula (F) include the following compounds:

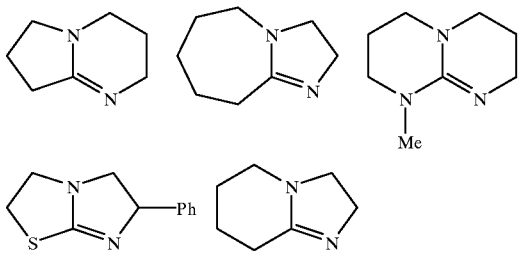

-continued

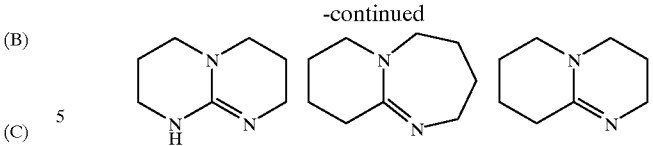

Among these, preferred are 1,8-diazabicyclo-[5.4.0]undec-7-ene and 1,5-diazabicyclo[4.3.0]non-5-ene.

The nitrogen-containing basic compound having two or more nitrogen atoms different in the chemical environment within one molecule is more preferably a compound having both a substituted or unsubstituted amino group and a ring structure containing a nitrogen atom, or a compound having an alkylamino group. Specific preferred examples thereof include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Examples of particularly preferred compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole, methyldiphenylimidazole, tris(methoxyethyl)amine, tris(methoxyethoxyethyl)amine, tris(ethoxyethoxyethyl)amine, tris(methoxymethoxymethyl)amine and tris(methoxymethoxyethyl)amine, however, the present invention is not limited thereto.

Further, a hydroxide compound of quaternary ammonium salt can also be used instead of the above-described basic compound. In this case, the hydroxide compound can be used alone or in combination with the basic compound.

Specific examples of the hydroxide compound include tetramethylammonium hydroxide, trimethyl(2-hydroxyethyl) ammonium hydroxide, tetraethylammonium hydroxide, tetrabutylammonium hydroxide, tetraethanolammonium hydroxide, methyltriethanolammonium hydroxide, benzylmethyldiethanolammonium hydroxide, benzyltriethanolammonium hydroxide, and tetrapropylammonium hydroxide.

These nitrogen-containing basic compounds may be used either individually or in combination of two or more thereof.

The amount of the nitrogen-containing basic compound used is usually from 0.001 to 10 parts by weight, preferably from 0.01 to 5 parts by weight, based on 100 parts by weight of the photosensitive resin composition (excluding a solvent). If the amount used is less than 0.001 parts by weight, the above-described may not be obtained, whereas if it exceeds 10 parts by weight, the sensitivity is liable to decrease or the developability in the unexposed area is readily deteriorated.

The chemical amplification-type positive photoresist composition of the present invention may additionally contain, if desired, a surfactant, a dye, a pigment, a plasticizer, a photosensitizer and a compound having two or more phenolic OH groups and capable of accelerating the solubility in a developer.

The photosensitive resin composition of the present invention preferably contains a surfactant. Specific examples thereof include nonionic surfactants including polyoxyethylene alkyl ethers such as polyoxyethylene lauryl ether, polyoxyethylene stearyl ether, polyoxyethylene cetyl ether and polyoxyethylene oleyl ether, polyoxyethylene alkyl aryl ethers such as polyoxyethylene octyl phenol ether and polyoxyethylene nonyl phenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-containing surfactants such as Eftop EF301, EF303 and EF352 (produced by Shin-Akita Kasei K. K.), Megafac F171, F173, F176, F189 and R08 (produced by Dainippon Ink & Chemicals, Inc.), Florad FC430 and FC431 (produced by Sumitomo 3M Inc.), and Asahi-Guard AG710, Surflon S-382, SC101, SC102, SC103, SC104, SC105 and SC106 (produced by Asahi Glass Co., Ltd.); organosiloxane polymer KP-341 (produced by Shin-Etsu Chemical Co., Ltd.); and acrylic acid- or methacrylic acid-based (co)polymers Polyflow No. 75 and No. 95 (produced by Kyoei Sha Yushi Kagaku Kogyo K. K.), and Troysol S-366 (produced by Troy Chemical K. K.).

Among these surfactants, fluorine-containing and silicon-containing surfactants are preferred in view of coatability and reduction in the development defect.

The amount of the surfactant blended is usually from 0.01 to 2 wt %, preferably from 0.01 to 1 wt %, based on the solid content of all components in the composition of the present invention.

These surfactants may be used either individually or in combination of two or more thereof.

Furthermore, a spectral sensitizer described below may be added to sensitize the composition to a wavelength region longer than the far ultraviolet region, where the photo-acid generator used does not have absorption, so that the chemically amplification-type positive resist of the present invention can have sensitivity to the i- or g-line. Specific examples of suitable spectral sensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene, however, the present invention is not limited thereto.

The compound having two or more phenolic OH groups, which can accelerate the solubility in a developer, includes polyhydroxy compounds. Preferred examples of the polyhydroxy compound include phenols, resorcin, phloroglucin, phloroglucide, 2,3,4-trihydroxybenzophenone, 2,3,4,4'-tetrahydroxybenzophenone, $\alpha,\alpha',\alpha''$-tris(4-hydroxyphenyl)-1,3,5-triisopropylbenzene, tris(4-hydroxyphenyl)methane, tris(4-hydroxyphenyl)ethane and 1,1'-bis(4-hydroxyphenyl)cyclohexane.

The chemical amplification-type positive photo-sensitive composition of the present invention is coated on a support after dissolving it in a solvent which dissolves the above-described components. Preferred examples of the solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofurane. These solvents are used individually or in combination.

The chemical amplification-type positive photoresist composition is coated on a substrate (a substrate coated, for example, with silicon/silicon dioxide) for use in the production of precision integrated circuit devices by an appropriate coating method such as spinner and coater, exposed through a predetermined mask, baked and then developed, whereby a good resist pattern can be obtained.

Examples of the developer for the chemical amplification-type positive photoresist composition of the present invention include an aqueous solution of alkalis including inorganic alkalis such as sodium hydroxide, potassium hydroxide, sodium carbonate, sodium silicate, sodium phosphate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimetylethanolamine and triethanolamine, amides such as formamide and acetamide, quaternary ammonium salts such as tetramethylammonium hydroxide, trimethyl(2-hydroxyethyl) ammonium hydroxide, tetraethylammonium hydroxide, tributylmethylammonium hydroxide, tetraethanolammonium hydroxide, methyltriethanolammonium hydroxide, benzylmethyldiethanolammonium hydroxide, benzyldimethylethanolammonium hydroxide, benzyltriethanolammonium hydroxide, tetrapropylammonium hydroxide and tetrabutylammonium hydroxide, and cyclic amines such as pyrrole and piperidine.

The present invention is described in greater detail below by referring to the Examples, however, the present invention should not be construed as being limited thereto.

SYNTHESIS EXAMPLES OF RESIN

In the synthesis of resin, the acetalization may be achieved by either a method using a vinyl ether or an acetal exchange method using an alcohol and an alkyl vinyl ether.

Also, for attaining efficient and stable synthesis, the following dehydration azeotropic method may be preferably used. However, these synthesis methods are set forth only for the purpose of showing an example and the synthesis is not limited thereto.

Synthesis Example 1

Synthesis of Resin A'-1

VP15000 (1,800 g) produced by Nippon Soda and propylene glycol monomethyl ether acetate (PGMEA) (8,200 g) were dissolved in a flask and by performing vacuum distillation, water and PGMEA were azeotropically distilled off.

After confirming that the water content was satisfactorily reduced, a solution obtained by adding pyridinium-p-toluene sulfonate (9.0 g) to cyclohexane ethanol (576.2 g) and dissolving it was added to the reaction solution and further, t-butyl vinyl ether (450.2 g) was added. The resulting solution was stirred at room temperature for 5 hours.

Thereto, piperidine (142.2 g) and acetic anhydride (153.2 g) were added and the solution was stirred at room temperature for 2 hours. To the reaction solution, water (3.6 λ) and ethyl acetate (7.2 λ) were added and after liquid separation and water washing, ethyl acetate, water and PGMEA in the azeotropic portion were removed by distillation under reduced pressure to obtain alkali-soluble Resin A'-1 having a substituent according to the present invention (30% PGMEA solution).

Synthesis Example 2

Synthesis of Resin A'-2 p-Acetoxystyrene monomer (or p-t-butoxystyrene monomer) and 4-t-butylstyrene monomer were polymerized using dimethyl 2,2'-azobisisobutyrate (AIBN) as an initiator and then deprotected by hydrochloric acid or the like to obtain p-hydroxystyrene/p-t-butylstyrene Copolymer (93/7) R-1.

R-1 (25 g) and propylene glycol monomethyl ether acetate (PGMEA) (120 g) were dissolved in a flask and by performing vacuum distillation, water and PGME were azeotropically removed. After confirming that the water content was satisfactorily reduced, a solution obtained by adding pyridinium-p-toluene sulfonate (0.12 g) to cyclohexane ethanol (3.5 g) and dissolving it was added to the reaction solution and further t-butyl vinyl ether was added. The resulting solution was stirred at room temperature for 5 hours.

Triethylamine (0.1 g) was added to the reaction solution to stop the reaction, water (50 ml) and ethyl acetate (100 ml) were added thereto and after liquid separation and water washing, ethyl acetate, water and PGMEA in the azeotropic portion were removed by distillation under reduced pressure to obtain alkali-soluble Resin A'-2 having a substituent according to the present invention (30% PGMEA solution).

Synthesis Example 3

Synthesis of Resin A'-3

VP15000 (1,800 g) produced by Nippon Soda and propylene glycol monomethyl ether acetate (PGMEA) (8,200 g) were dissolved in a flask and by performing vacuum distillation, water and PGMEA were azeotropically distilled off.

After confirming that the water content was satisfactorily reduced, a solution obtained by adding pyridinium-p-toluene sulfonate (9.0 g) to cyclohexane ethanol (576.2 g) and dissolving it was added to the reaction solution and further, t-butyl vinyl ether (450.2 g) was added. The resulting solution was stirred at room temperature for 5 hours.

Water (3.6 λ) and ethyl acetate (7.2 λ) were added to the reaction solution and after liquid separation and water washing, ethyl acetate, water and PGMEA in the azeotropic portion were removed by distillation under reduced pressure to obtain alkali-soluble Resin A'-3 having a substituent according to the present invention (30% PGMEA solution).

Synthesis Example 4

Synthesis of Resin B'-4

VP15000 (100 g) produced by Nippon Soda and propylene glycol monomethyl ether acetate (PGMEA) (400 g) were dissolved in a flask and by performing vacuum distillation, water and PGMEA were azeotropically distilled off.

After confirming that the water content was satisfactorily reduced, ethyl vinyl ether (25.0 g) and p-toluenesulfonic acid (0.02 g) were added and the resulting solution was stirred at room temperature for 1 hour.

Triethylamine (0.03 g) was added to the reaction solution to stop the reaction, water (400 ml) and ethyl acetate (800 ml) were added and after liquid separation and water washing, ethyl acetate, water and PGMEA in the azeotropic portion were removed by distillation under reduced pressure to obtain alkali-soluble Resin B'-4 having a substituent according to the present invention (30% PGMEA solution).

Synthesis Example 5

Synthesis of Resin B'-5 p-Acetoxystyrene monomer (or p-t-butoxystyrene monomer) and cyclohexyl acrylate monomer were polymerized using dimethyl 2,2'-azobisisobutyrate (AIBN) as an initiator and then deprotected by hydrochloric acid or the like to obtain p-hydroxystyrene/cyclohexyl acrylate Copolymer (90/10) R-2.

Resin R-2 (100 g) and propylene glycol monomethyl ether acetate (PGMEA) (400 g) were dissolved in a flask and by performing vacuum distillation, water and PGME were azeotropically removed. After confirming that the water content was satisfactorily reduced, ethyl vinyl ether (25.0 g) and p-toluenesulfonic acid (0.02 g) were added and the resulting solution was stirred at room temperature for 1 hour.

Triethylamine (0.03 g) was added to the reaction solution to stop the reaction, water (400 ml) and ethyl acetate (800 ml) were added thereto and after liquid separation and water washing, ethyl acetate, water and PGMEA in the azeotropic portion were removed by distillation under reduced pressure to obtain alkali-soluble Resin B'-5 having a substituent according to the present invention (30% PGMEA solution).

Examples 1 to 30 and Comparative Example 1

Respective components shown in Tables 1 and 2 were dissolved in a PGMEA solvent at a weight ratio shown in Tables 1 and 2 to have a total weight ratio of 16% and the resulting solutions each was filtered through a 0.1-μm microfilter to prepare positive photoresist solutions of Examples 1 to 30 and Comparative Example 1.

(Evaluation Method of Shortening)

The obtained positive photoresist solution was coated on a silicon wafer having formed thereon a 70-nm film of organic BARC (DUV-42) produced by Nissan Chemical using a spin coater (Mark 8, manufactured Tokyo Electron) and dried at 120° C. for 90 seconds to form a resist film of about 0.83 μm. Thereon, a KrF excimer laser (FPA-3000EX5, manufactured by Canon, wavelength: 248 nm, NA=0.45, σ=0.50) was irradiated to expose the resist film. After the exposure, the film was heat-treated at 100° C. for 90 seconds, developed with an aqueous 2.38% tetramethylammonium hydroxide solution, rinsed with pure water and then spin-dried to obtain a resist pattern.

At this time, the resist pattern transferred on the substrate through the above-described process was composed of 5 lines having a periodicity with a ratio between the 0.30-μm line width and the space width being 1:1, where the length of each line was 1.8 μm (FIG. 1). In the evaluation of shortening, the third line from the right or left side and undertaking the center line out of 5 lines was examined.

Here, the shortening is defined. First, the exposure amount necessary for reproducing a ratio between line width and the space width of the above-described 5 lines is determined and the length in the longitudinal direction of the third line from the left or right side at that exposure amount is measured using a length measuring machine SEM:S-8840 manufactured by Hitachi, Ltd. Assuming that the obtained value is L (μm), the shrinkage in the longitudinal direction according to the following equation is determined as the shortening.

$$\text{Shortening }(\%)=((1.8-L)/1.8)\times 100(\%)$$

The results obtained are shown in Tables 1 and 2 below.

TABLE 1

| No. | Alkali-Soluble Resin | Photo-Acid Generator | Additive | Surfactant | Evaluation Results of Shortening (%) |
|---|---|---|---|---|---|
| Example 1 | (A'-1)(B'-4) = 7/3 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 6 |
| Example 2 | (A'-1)(B'-4) = 5/5 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 2 |
| Example 3 | (A'-1)(B'-4) = 3/7 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 1 |
| Example 4 | (A'-1)(B'-5) = 7/3 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 7 |
| Example 5 | (A'-1)(B'-5) = 5/5 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 3 |
| Example 6 | (A'-1)(B'-5) = 3/7 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 2 |
| Example 7 | (A'-2)(B'-4) = 7/3 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 7 |
| Example 8 | (A'-2)(B'-4) = 5/5 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 3 |
| Example 9 | (A'-2)(B'-4) = 3/7 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 2 |
| Example 10 | (A'-2)(B'-5) = 7/3 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 6 |
| Example 11 | (A'-2)(B'-5) = 5/5 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 3 |
| Example 12 | (A'-2)(B'-5) = 3/7 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 2 |
| Example 13 | (A'-3)(B'-4) = 7/3 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 6 |
| Example 14 | (A'-3)(B'-4) = 5/5 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 2 |
| Example 15 | (A'-3)(B'-4) = 3/7 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 1 |
| Example 16 | (A'-3)(B'-5) = 7/3 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 6 |
| Example 17 | (A'-3)(B'-5) = 5/5 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 2 |

TABLE 1-continued

| No. | Alkali-Soluble Resin | Photo-Acid Generator | Additive | Surfactant | Evaluation Results of Shortening (%) |
|---|---|---|---|---|---|
| Example 18 | (A'-3)(B'-5) = 3/7 weight ratio (96.25 parts by weight) | PAG4-4/PAG7-3 = 2/8 weight ratio (3.5 parts by weight) | Additive E-2 (0.25 part by weight) | F-2 (200 ppm based on entire resist solution) | 2 |
| Example 19 | (A'-1)/(B'-4) = 5/5 weight ratio (96.25 parts by weight) | PAG4-4/PAG7-3 = 2/8 weight ratio (3.5 parts by weight) | Additive E-4 (0.25 part by weight) | F-2 (200 ppm based on entire resist solution) | 2 |
| Example 20 | (A'-1)/(B'-4) = 5/5 weight ratio (96.25 parts by weight) | PAG4-4/PAG7-3 = 2/8 weight ratio (3.5 parts by weight) | Additive E-5 (0.25 part by weight) | F-2 (200 ppm based on entire resist solution) | 2 |
| Example 21 | (A'-1)/(B'-4) = 7/3 weight ratio (96.25 parts by weight) | PAG7-3 (3.5 parts by weight) | Additive E-2 (0.25 parts by weight) | F-2 (200 ppm based on entire resist solution) | 22 |
| Example 22 | (A'-1)/(B'-5) = 6/4 weight ratio (93.60 parts by weight) | (PAG4-38)/(PAG7-3) = 1/2 (4.5 parts by weight) | Additive E-8/ Additive E-9 = 37.4/0.1 (1.9 parts by weight) | F-2 (200 ppm based on entire resist solution) | 1 |
| Example 23 | (A'-1)/(B'-5) = 6/4 weight ratio (93.60 parts by weight) | (PAG4-38)/(PAG7-3) = 1/2 (4.5 parts by weight) | Additive E-8/ Additive E-10 = 37.4/0.1 (1.9 parts by weight) | F-2 (200 ppm based on entire resist solution) | 2 |
| Example 24 | (A'-1)/(B'-4) = 5/5 weight ratio (93.60 parts by weight) | (PAG4-38)/(PAG7-3) = 1/2 (4.5 parts by weight) | Additive E-8/ Additive E-9 = 37.4/0.1 (1.9 parts by weight) | F-2 (200 ppm based on entire resist solution) | 2 |
| Example 25 | (A'-1)/(B'-5) = 6/4 weight ratio (93.60 parts by weight) | (PAG4-38)/(PAG7-3) = 1/2 (4.5 parts by weight) | Additive E-7/ Additive E-9 = 37.4/0.1 (1.9 parts by weight) | F-2 (200 ppm based on entire resist solution) | 5 |
| Example 26 | (A'-1)/(B'-5) = 5/5 weight ratio (95.75 parts by weight) | (PAG4-78)/(PAG7-3) = 1/9 (4.0 parts by weight) | Additive E-5/ Additive E-11 = 76/24 (0.25 part by weight) | F-2 (200 ppm based on entire resist solution) | 2 |
| Example 27 | (A'-1)/(B'-5) = 5/5 weight ratio (95.75 parts by weight) | (PAG4-78)/(PAG7-3) = 1/9 (4.0 parts by weight) | Additive E-5/ Additive E-11 = 76/24 (0.25 part by weight) | F-2 (200 ppm based on entire resist solution) | 2 |
| Example 28 | (A'-1)/(B'-5) = 5/5 weight ratio (95.75 parts by weight) | (PAG4-78)/(PAG7-3) = 1/9 (4.0 parts by weight) | Additive E-5/ Additive E-12 = 76/24 (0.25 part by weight) | F-2 (200 ppm based on entire resist solution) | 5 |
| Example 29 | (A'-1)/(B'-5) = 5/5 weight ratio (95.75 parts by weight) | (PAG4-78)/(PAG7-3) = 1/9 (4.0 parts by weight) | Additive E-5/ Additive E-13 = 76/24 (0.25 part by weight) | F-2 (200 ppm based on entire resist solution) | 3 |
| Example 30 | (A'-1)/(B'-5) = 5/5 weight ratio (95.75 parts by weight) | (PAG4-78)/(PAG7-3) = 1/9 (4.0 parts by weight) | Additive E-5/ Additive E-13 = 76/24 (0.25 part by weight) | F-2 (200 ppm based on entire resist solution) | 3 |
| Comparative Example 1 | A'-3 (96.25 parts by weight) | (PAG4-38)/(PAG7-3) = 1/2 (4.5 parts by weight) | Additive E-2 (0.25 parts by weight) | F-2 (200 ppm based on entire resist solution) | 35 |

The organic base used were (E-2), (E-4), (E-5) and (E-11) to (E-13) each having a structure shown below, the carboxylic acid generator used were (E-7) and (E-8) each having a structure shown below, and other additives used were (E-9) and (E-10).

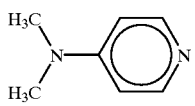
(E-1)

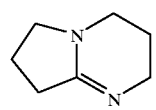
(E-2)

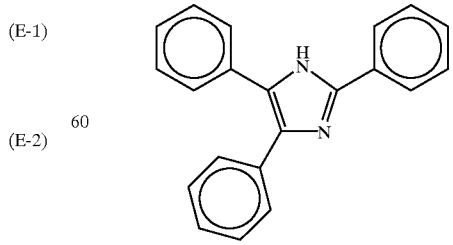
(E-3)

-continued (E-4) 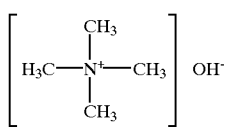

(E-5) 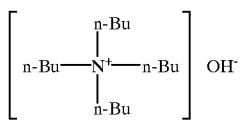

(E-7) 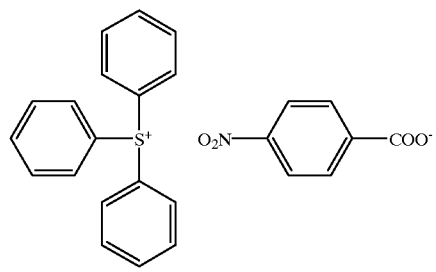

(E-8) 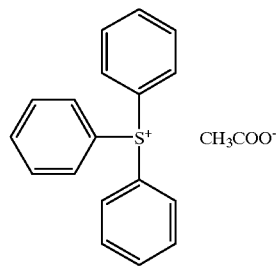

(E-9) 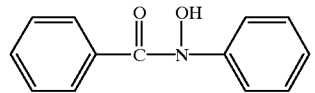

(E-10) 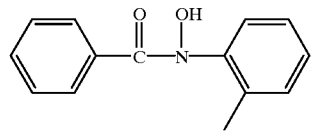

(E-11) 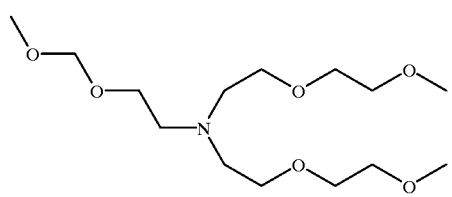

(E-12) 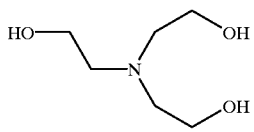

-continued (E-13) 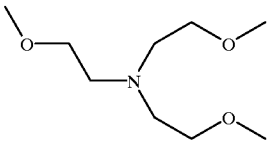

Surfactant (F-2) used was Troysol S-366 (produced by Troy Chemical).

As shown in Tables 1 and 2, the compositions of the present invention are remarkably improved in the shortening as compared with the composition of Comparative Example.

According to the present invention, a chemical amplification-type positive photoresist composition improved in the shortening at the line pattern edge part (in the longitudinal direction) is provided.

While the invention has been described in detail and with reference to specific embodiments thereof, it will be apparent to one skilled in the art that various changes and modifications can be made therein without departing from the spirit and scope thereof.

What is claimed is:

1. A positive photoresist composition comprising:

(a) a resin (A) having a structural unit containing a group represented by the following formula (X) and capable of decomposing under the action of an acid to increase the solubility in an alkali developer, a resin (B) having a structural unit containing a group represented by the following formula (Y) and capable of decomposing under the action of an acid to increase the solubility in an alkali developer, and (b) a compound capable of generating an acid upon irradiation with actinic rays or radiation:

(X)

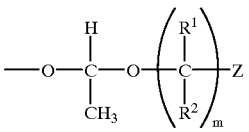

wherein $R^1$ and $R^2$, which may be the same or different, each represents a hydrogen atom, a linear, branched or cyclic alkyl group which may have a substituent, m represents an integer of 1 to 20, Z represents

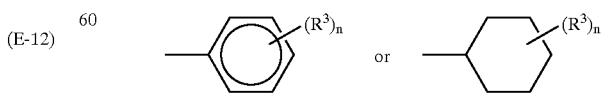

wherein $R^3$ represents a linear, branched or cyclic alkyl group which may have a substituent, an aryl group which may have a substituent, or an aralkyl group which may have a substituent, and n represents an integer of 0 to 5;

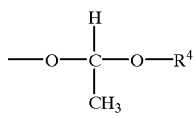
(Y)

wherein $R^4$ represents a lower alkyl group having from 1 to 4 carbon atoms.

2. A positive photoresist composition comprising:
(a) a resin (A') having structural units represented by the following formulae (I), (II) and (III) and capable of decomposing under the action of an acid to increase the solubility in an alkali developer,
a resin (B') having a structural unit represented by the following formulae (IV), (V) and (VI) and capable of decomposing under the action of an acid to increase the solubility in an alkali developer, and
(b) a compound capable of generating an acid upon irradiation with actinic rays or radiation:

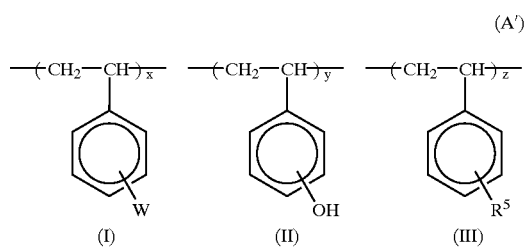
(A')

wherein $R^5$ represents an acid-stable group, W represents a group represented by formula (X), x and y each represents a number of 1 to 100, and z represents a number of 0 to 100, provided that x+y+z=100;

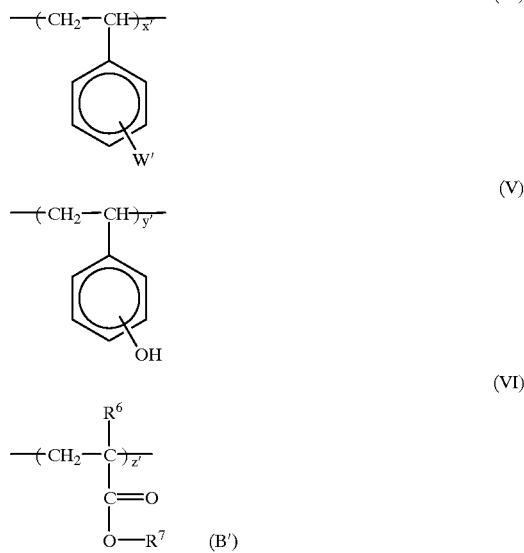
(IV)
(V)
(VI)

wherein $R^6$ represents a hydrogen atom or a methyl group, $R^7$ represents a linear, branched or cyclic alkyl group, an aryl group which may have a substituent or an aralkyl group which may have a substituent, W' represents a group represented by formula (Y), x' and y' each represents a number of 1 to 100, and z' represents a number of 0 to 100, provided that x'+y'+z'=100.

3. The positive photoresist composition as claimed in claim 1, wherein the compound (b) capable of generating an acid upon irradiation with actinic rays or radiation is a compound having a sulfonium salt structure or a compound having a diazodisulfone structure.

4. The positive photoresist composition as claimed in claim 1, wherein the compound (b) capable of generating an acid upon irradiation with actinic rays or radiation is a mixture of a compound having a sulfonium salt structure and a compound having a diazodisulfone structure.

5. The positive photoresist composition as claimed in claim 1, wherein the resin (A) and the resin (B) each has a weight average molecular weight of from 3,000 to 200,000.

6. The positive photoresist composition as claimed in claim 1, wherein the contents of the resin (A) and the resin (B) in the positive photoresist composition are each from 50 to 99 wt %.

7. The positive photoresist composition as claimed in claim 1, wherein the mixing ratio of the resin (A) and the resin (B) is:

$0.1 \leq (A)/\{(A)+(B)\} \leq 0.9$ (by weight).

8. The positive photoresist composition as claimed in claim 1, wherein the amount of the compound (b) is from 0.001 to 40 wt % based on the solid contents in the composition.

9. The positive photoresist composition as claimed in claim 1, which further comprises a nitrogen-containing cyclic compound or a nitrogen-containing basic compound having two or more nitrogen atoms different in the chemical environment within one molecule.

10. The positive photoresist composition as claimed in claim 9, wherein the nitrogen-containing cyclic compound is represented by the following formula (F):

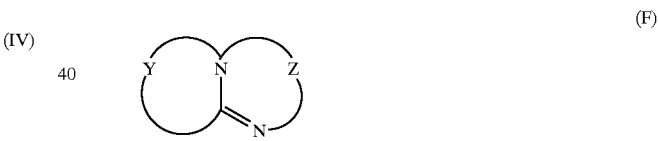
(F)

wherein Y and Z each independently represents a linear, branched or cyclic alkylene group which may contain a hetero atom and may be substituted.

11. The positive photoresist composition as claimed in claim 1, which further comprises a surfactant.

12. The positive photoresist composition as claimed in claim 2, wherein the compound (b) capable of generating an acid upon irradiation with actinic rays or radiation is a compound having a sulfonium salt structure or a compound having a diazodisulfone structure.

13. The positive photoresist composition as claimed in claim 2, wherein the compound (b) capable of generating an acid upon irradiation with actinic rays or radiation is a mixture of a compound having a sulfonium salt structure and a compound having a diazodisulfone structure.

14. The positive photoresist composition as claimed in claim 2, wherein the resin (A') and the resin (B') each has a weight average molecular weight of from 3,000 to 200,000.

15. The positive photoresist composition as claimed in claim 2, wherein the contents of the resin (A') and the resin (B') in the positive photoresist composition are each from 50 to 99 wt %.

16. The positive photoresist composition as claimed in claim 2, wherein the amount of the compound (b) is from 0.001 to 40 wt % based on the solid contents in the composition.

17. The positive photoresist composition as claimed in claim 2, which further comprises a nitrogen-containing cyclic compound or a nitrogen-containing basic compound having two or more nitrogen atoms different in the chemical environment within one molecule.

18. The positive photoresist composition as claimed in claim 17, wherein the nitrogen-containing cyclic compound is represented by the following formula (F):

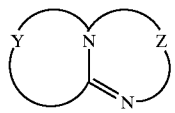

(F)

wherein Y and Z each independently represents a linear, branched or cyclic alkylene group which may contain a hetero atom and may be substituted.

19. The positive photoresist composition as claimed in claim 2, which further comprises a surfactant.

* * * * *